United States Patent
Huang et al.

(10) Patent No.: US 10,886,302 B1
(45) Date of Patent: Jan. 5, 2021

(54) DEVICE SUBSTRATE

(71) Applicant: Au Optronics Corporation, Hsinchu (TW)

(72) Inventors: Pao-Yu Huang, Hsinchu County (TW); Kuan-Yu Chen, Hsinchu (TW)

(73) Assignee: Au Optronics Corporation, Hsinchu (TW)

(*) Notice: Subject to any disclaimer, the term of this patent is extended or adjusted under 35 U.S.C. 154(b) by 0 days.

(21) Appl. No.: 16/783,179

(22) Filed: Feb. 6, 2020

(30) Foreign Application Priority Data

Jun. 17, 2019 (TW) ................ 108120866 A

(51) Int. Cl.
*H01L 27/12* (2006.01)
*G09G 3/20* (2006.01)

(52) U.S. Cl.
CPC ........ *H01L 27/1218* (2013.01); *H01L 27/124* (2013.01); *G09G 3/20* (2013.01); *G09G 2300/0408* (2013.01); *G09G 2310/0267* (2013.01); *G09G 2310/08* (2013.01)

(58) Field of Classification Search
CPC ..... H01L 27/1218; H01L 27/124; G09G 3/20; G09G 2300/0408; G09G 2310/08
USPC .................................. 327/108–112
See application file for complete search history.

(56) References Cited

U.S. PATENT DOCUMENTS

| 9,240,399 B2 | 1/2016 | Chen | |
|---|---|---|---|
| 2011/0157263 A1* | 6/2011 | Kim | G11C 19/28 345/698 |
| 2015/0325564 A1* | 11/2015 | Chen | H01L 27/124 257/390 |

FOREIGN PATENT DOCUMENTS

| CN | 102034423 | 4/2011 |
|---|---|---|
| CN | 105047125 | 11/2015 |
| CN | 108230986 | 6/2018 |
| TW | 201227123 | 7/2012 |
| TW | 201533717 | 9/2015 |
| TW | 201543448 | 11/2015 |

OTHER PUBLICATIONS

"Office Action of Taiwan Counterpart Application", dated Oct. 28, 2020, p. 1-p. 15.

* cited by examiner

*Primary Examiner* — Tomi Skibinski
(74) *Attorney, Agent, or Firm* — JCIPRNET

(57) ABSTRACT

A device substrate includes a substrate, a first output circuit, a first auxiliary circuit, and a first backup circuit. The substrate has an active area and a peripheral area located on at least one side of the active area. A cutting path overlaps the active area and the peripheral area. The first output circuit is located on the peripheral area. The first auxiliary circuit is located on the peripheral area. The first auxiliary circuit overlaps the cutting path. The first backup circuit is located on the peripheral area and is electrically connected with the first auxiliary circuit. The first auxiliary circuit and the first backup circuit are pull-down circuits or are pull-up circuits. The shortest distance between the first backup circuit and the cutting path is from 125 microns to 300 microns.

19 Claims, 27 Drawing Sheets

DEVICE SUBSTRATE

CROSS-REFERENCE TO RELATED APPLICATION

This application claims the priority benefit of Taiwan application serial no. 108120866, filed on Jun. 17, 2019. The entirety of the above-mentioned patent application is hereby incorporated by reference herein and made a part of this specification.

BACKGROUND

Technical Field

The present invention relates to a device substrate, and more particularly, to a device substrate having a backup circuit.

Description of Related Art

With the development of science and technology, simply improving the display quality of display panels has made it difficult to meet consumer demands for new products. In order to increase the attractiveness of the products, various manufacturers are committed to the development of a shaped display panel. The shaped display panel is different from conventional rectangular display panels. The appearance variability of the shaped display panel can attract the attention of consumers.

Currently, a large panel is typically cut to obtain a particular shaped display panel, thereby saving the cost of a photomask required to manufacture the shaped display panel. However, if a driving circuit of the large panel is damaged in a cutting process, the produced shaped display panel may not operate normally in most cases. Therefore, there is an urgent need for a method capable of improving the yield of the cutting process.

SUMMARY

The present invention provides a device substrate, which can improve the yield of a cutting process.

At least one embodiment of the present invention provides a device substrate, which includes a substrate, a first output circuit, a first auxiliary circuit, and a first backup circuit. The substrate has an active area and a peripheral area adjacent to the active area. A cutting path overlaps the active area and the peripheral area. The first output circuit is located on the peripheral area. The first auxiliary circuit is located on the peripheral area. The first auxiliary circuit overlaps the cutting path. The first backup circuit is located on the peripheral area and is electrically connected with the first auxiliary circuit. The first auxiliary circuit and the first backup circuit are pull-down circuits or are pull-up circuits. The shortest distance between the first backup circuit and the cutting path is from about 125 microns to about 300 microns.

At least one embodiment of the present invention provides a device substrate, which includes a substrate, a first driving unit and a second driving unit. The substrate has an active area and a peripheral area adjacent to the active area. The first driving unit is located on the substrate, and includes a first output circuit, a first auxiliary circuit, a first backup circuit, and a second auxiliary circuit. The first auxiliary circuit is located on the peripheral area. The first backup circuit is electrically connected with the first auxiliary circuit. The first auxiliary circuit and the first backup circuit are pull-up circuits or are pull-down circuits, and receive a same signal. The second auxiliary circuit is located on the peripheral area. The second driving unit is located on the substrate, and includes a second output circuit, a third auxiliary circuit, a second backup circuit, and a fourth auxiliary circuit. The third auxiliary circuit is located on the peripheral area. The second backup circuit is electrically connected with the third auxiliary circuit. The third auxiliary circuit and the second backup circuit are pull-up circuits or are pull-down circuits. The fourth auxiliary circuit is located on the peripheral area.

At least one embodiment of the present invention provides a device substrate, which includes a substrate, a first driving unit, a second driving unit, and a first connection line. The substrate has an active area and a peripheral adjacent to the active area. The first driving unit is located on the substrate, and includes a first output circuit, a first auxiliary circuit and a second auxiliary circuit. The first auxiliary circuit is located on the peripheral area. The second auxiliary circuit is located on the peripheral area. The second driving unit is located on the substrate, and includes a second output circuit, a first backup circuit and a third auxiliary circuit. The first backup circuit is located on the peripheral area. The third auxiliary circuit is located on the peripheral area. The first connection line electrically connects the first backup circuit to the first auxiliary circuit. The first backup circuit and the first auxiliary circuit are pull-up circuits or are pull-down circuits, and receive a same signal.

One of the objects of the present invention is to increase the yield of a cutting process of a device substrate.

One of the objects of the present invention is to obtain a device substrate having high flexible dimension choices by shape cutting.

In order to make the aforementioned and other objectives and advantages of the present invention comprehensible, embodiments accompanied with figures are described in detail below.

DESCRIPTION OF THE EMBODIMENTS

It should be understood that although terms such as "first", "second", and "third" in this specification may be used for describing various elements, components, areas, layers, and/or parts, the elements, components, areas, layers, and/or parts are not limited by such terms. The terms are only used to distinguish one element, component, area, layer, or part from another element, component, area, layer, or part. Therefore, the "first element", "component, "area", "layer", or "part" described below may also be referred to as a second element, component, area, layer, or part without departing from the teachings of the present invention.

Figure 1A:
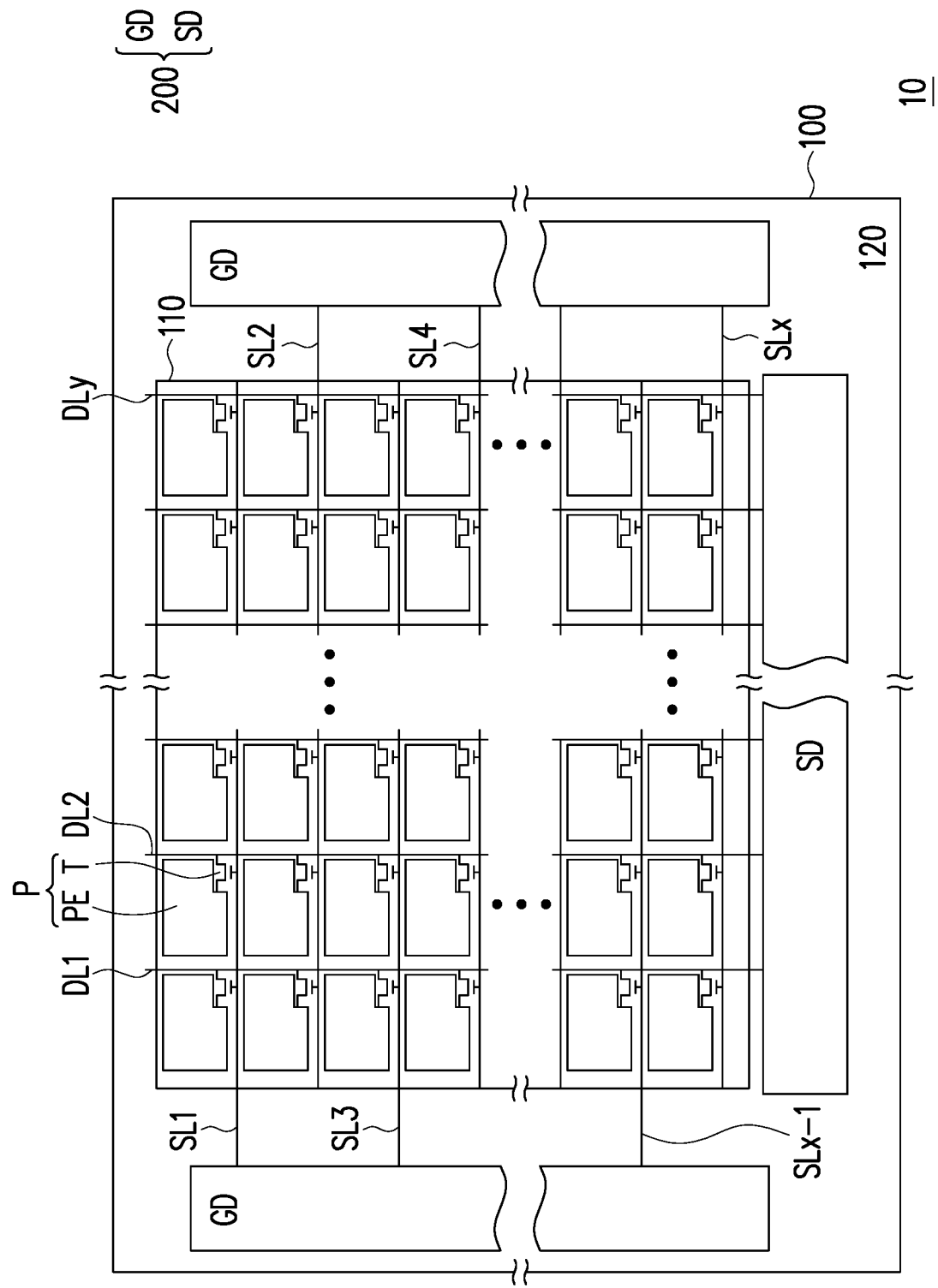
FIG. 1A is a schematic top view of a device substrate according to an embodiment of the present invention.

FIG. 1A is a schematic top view of a device substrate according to an embodiment of the present invention.

Referring to FIG. 1A, a device substrate 10 includes a substrate 100, a driving circuit 200, a plurality of scan lines SL1-SLx, a plurality of data lines DL1-DLy, and a plurality of pixel structures P. The substrate 100 has an active area 110 and a peripheral area 120 located on at least one side of the active area 110 and adjacent to the active area 110.

The driving circuit 200 is located on the peripheral area 120. The driving circuit 200 includes a gate driving circuit GD and a source driving circuit SD. The gate driving circuit GD is, for example, a gate driver-on-array (GOA). The source driving circuit SD is, for example, a chip or another suitable driving apparatus.

The plurality of scan lines SL1-SLx, the plurality of data lines DL1-DLy and the plurality of pixel structures P are located on the active area 110.

The scan lines SL1-SLx are electrically connected with the gate driving circuit GD. The data lines DL1-DLy are electrically connected with the source driving circuit SD. In the present embodiment, the plurality of gate driving circuits GD are respectively located on two opposite sides of the substrate 100, and gate signals of respective stages are respectively provided to the scan lines SL1-SLx in a double-sided single-drive manner, but the present invention is not limited thereto. In other embodiments, the gate signals of the respective stages may be respectively provided to the scan lines SL1-SLx by using a single-sided single-drive or double-sided double-drive technology. The scan lines SL1-SLx and the data lines DL1-DLy are arranged to intersect each other, and an insulating layer is interposed between the scan lines SL1-SLx and the data lines DL1-DLy. In other words, an extension direction of the scan lines SL1-SLx is not parallel to an extension direction of the data lines DL1-DLy. Preferably, the extension direction of the scan lines SL1-SLx is perpendicular to the extension direction of the data lines DL1-DLy. Based on the conductivity considerations, the scan lines SL1-SLx and the data lines DL1-DLy generally are made by a metal material. However, the present invention is not limited thereto. According to other embodiments, the scan lines SL1-SLx and the data lines DL1-DLy may be made by other conductive materials, such as alloy, a nitride of a metal material, an oxide of a metal material, an oxynitride of a metal material or other suitable materials or stacked layers of the metal material and other conductive materials.

The pixel structure P includes an active device T and a pixel electrode PE. The active device T may be a bottom gate type thin film transistor or a top gate type thin film transistor, including a gate, a passage, a source, and a drain. The active device T is electrically connected with the corresponding one of the scan lines SL1-SLx and the corresponding one of the data lines DL1-DLy. In addition, the active device T is electrically connected with the pixel electrode PE. In the present embodiment, the active area 110 may serve as a display area, an array of pixel structures P located in the active area 110 may be matched with a liquid crystal layer (not illustrated), an opposite substrate (not illustrated), and a backlight module (not illustrated) to display a picture, but the present invention is not limited thereto. In other variations, the active area 110 may serve as a display area, and an array of pixel structures P located in the active area 110 may be matched with an electroluminescent device to display a picture.

Figure 1B:
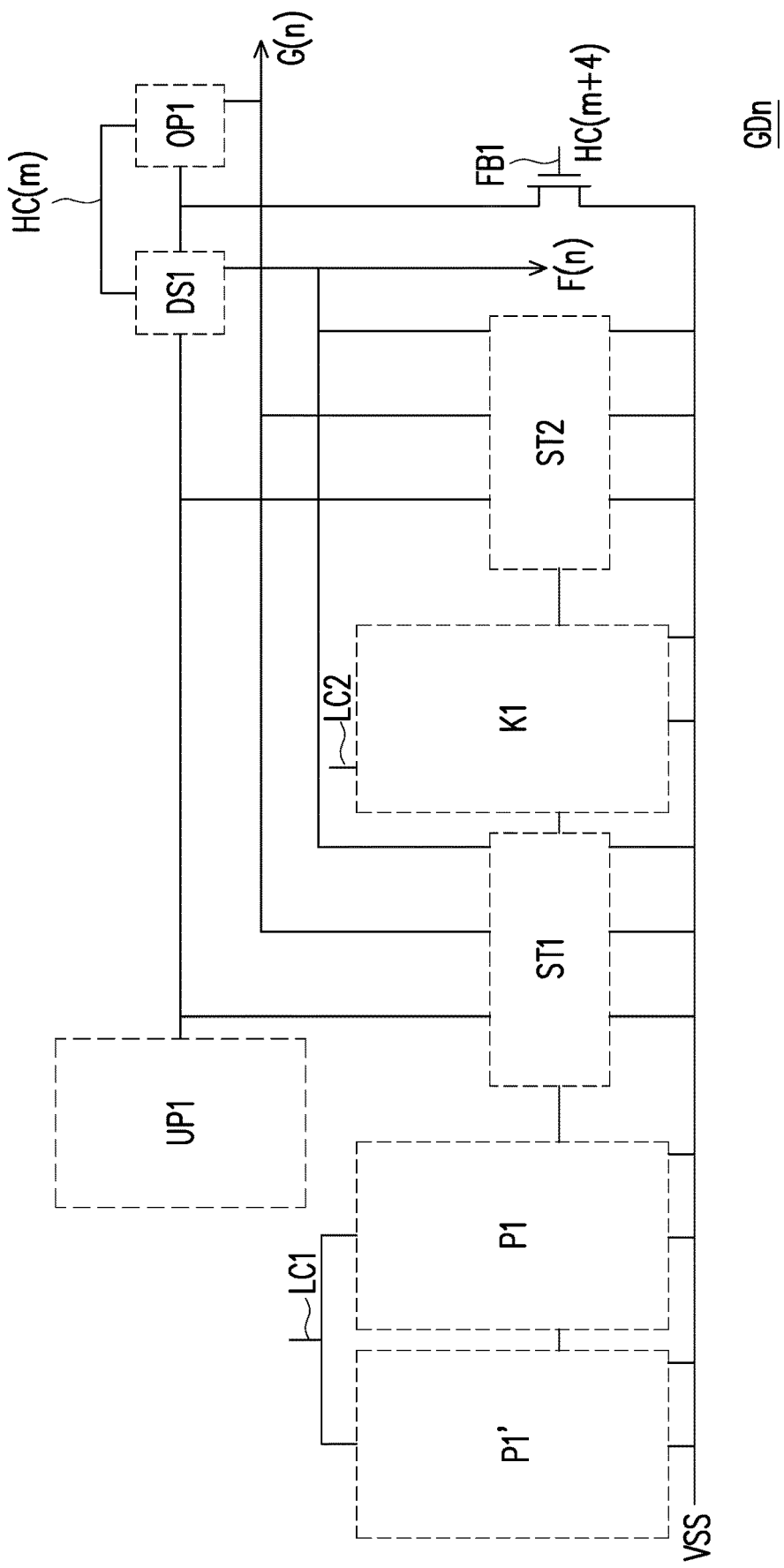
FIG. 1B is a schematic partial circuit diagram of the device substrate of FIG. 1A.

FIG. 1B is a schematic partial circuit diagram of the device substrate 10 of FIG. 1A. FIG. 1B illustrates the gate driving circuit GD corresponding to the scan line SLn. In other words, FIG. 1B shows an $n^{th}$-stage driving unit GDn electrically connected with the scan line SLn, where n is a positive integer of 1 to x. For convenience of explanation, FIG. 1B omits drawing of a part of lines. The details of the gate driving circuit GD will be described hereinafter. In the present embodiment, the gate driving circuit GD is, for example, a double-sided single-drive architecture. The $n^{th}$-stage driving unit GDn is located between an $(n-2)^{th}$-stage driving unit GDn-2 and an $(n+2)^{th}$-stage driving unit GDn+2. For example, odd-stage driving units such as a first-stage driving unit GD1, a third-stage driving unit GD3 and a fifth-stage driving unit GD5 are located on the left side of the active area 110, even-stage driving units such as a second-stage driving unit GD2, a fourth-stage driving unit GD4 and a sixth-stage driving unit GD6 are located on the right side of the active area 110, but the present invention is not limited thereto.

The $n^{th}$-stage driving unit GDn (or referred to as the first driving unit) includes a first output circuit OP1, a first auxiliary circuit P1 and a first backup circuit P1'. The first auxiliary circuit P1 and the first backup circuit P1' are both pull-down circuits or are both pull-up circuits. The first backup circuit P1' may serve as a backup circuit of the first auxiliary circuit P1. The first backup circuit P1' and the first auxiliary circuit P1 transmit the same signal. The $n^{th}$-stage driving unit GDn further includes a second auxiliary circuit K1, a first downlink circuit DS1, a first voltage stabilizing circuit ST1, a second voltage stabilizing circuit ST2, a first voltage control circuit UP1, and a first feedback device FB1. In other words, the first backup circuit P1', the first output circuit OP1, the first auxiliary circuit P1, the second auxiliary circuit K1, the first downlink circuit DS1, the first voltage stabilizing circuit ST1, the second voltage stabilizing circuit ST2, the first voltage control circuit UP1, and the first feedback device FB1 are located in the $n^{th}$-stage driving unit.

The first output circuit OP1, the first auxiliary circuit P1, the first backup circuit P1', the second auxiliary circuit K1, the first downlink circuit DS1, the first voltage stabilizing circuit ST1, the second voltage stabilizing circuit ST2, the first voltage control circuit UP1, and the first feedback device FB1 are located on the peripheral area 120.

In the present embodiment, the first auxiliary circuit P1 and the first backup circuit P1' are both pull-down circuits, and the first voltage control circuit UP1 is a pull-up circuit. A power line VSS is electrically connected with the first auxiliary circuit P1, the first backup circuit P1', the second auxiliary circuit K1, the first voltage stabilizing circuit ST1, the second voltage stabilizing circuit ST2, and the first feedback device FB1.

Figure 1C:
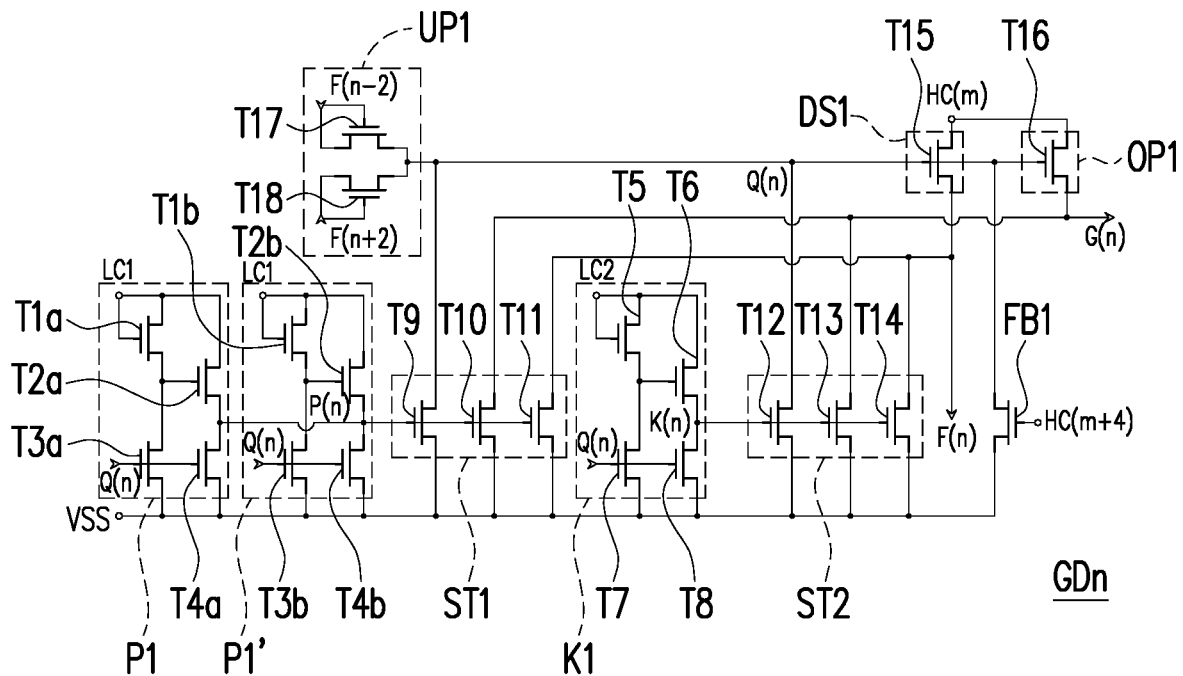
FIG. 1C is a schematic partial circuit of the device substrate of FIG. 1A.
Figure 1C:
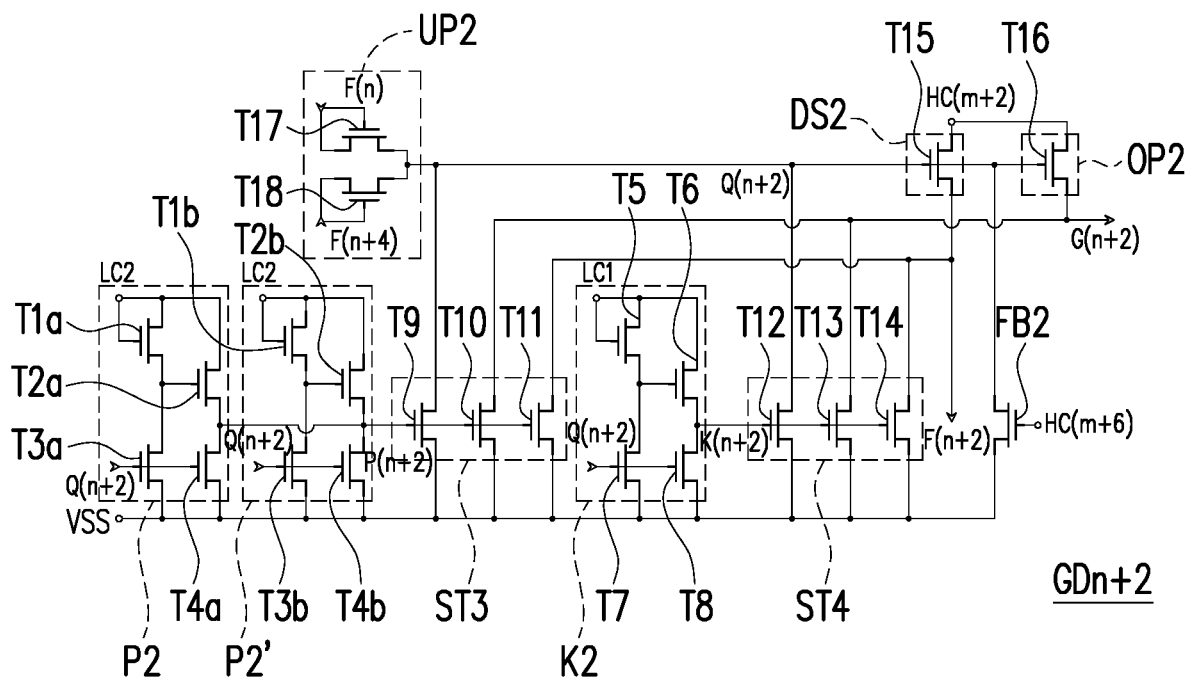
Figure 1D:
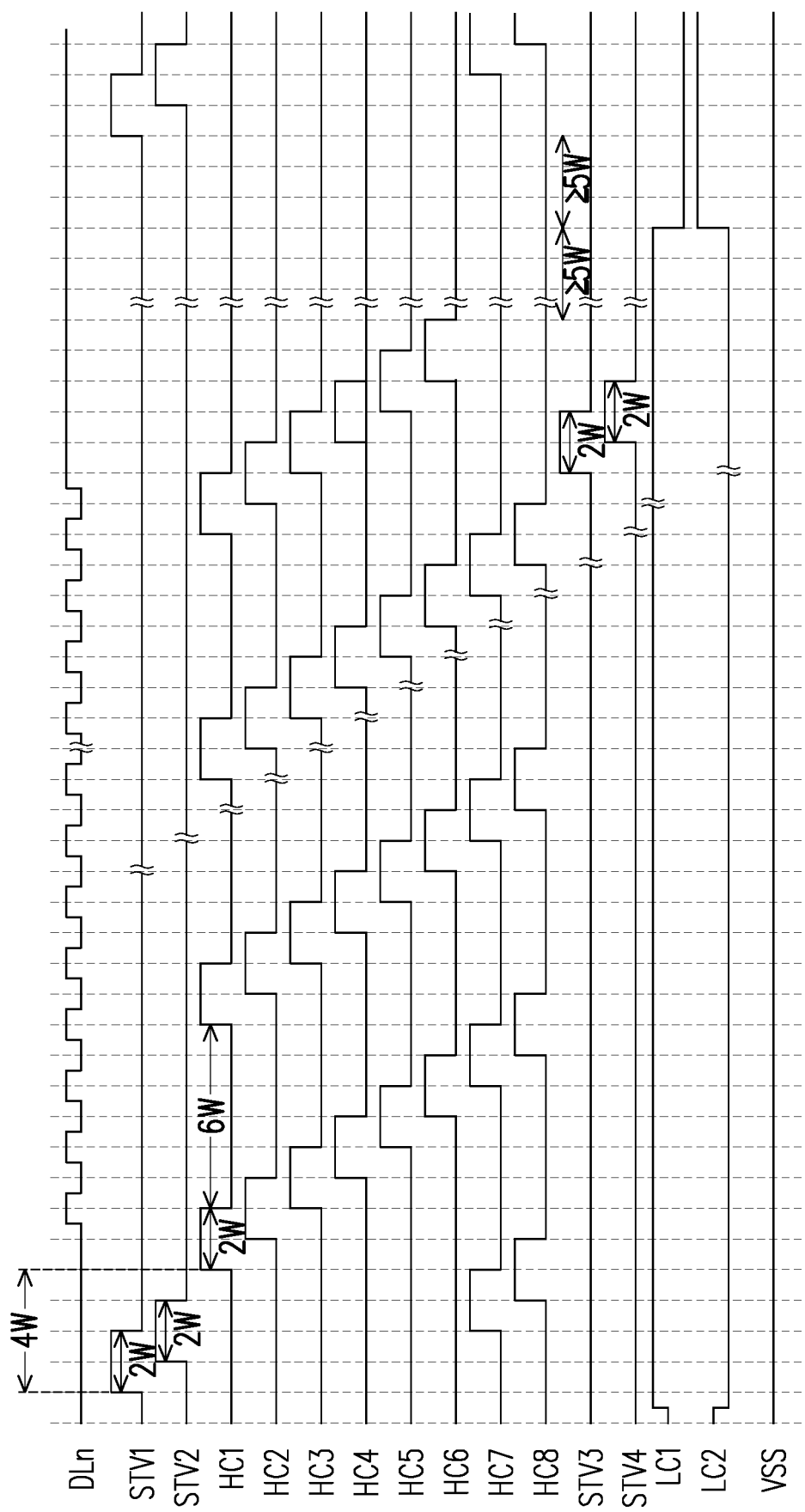
FIG. 1D is a signal timing diagram of the device substrate of FIG. 1A.

FIG. 1C is a schematic partial circuit of the device substrate of FIG. 1A. FIG. 1C illustrates a schematic partial circuit of the $n^{th}$-stage driving unit GDn and the $(n+2)^{th}$-stage driving unit GDn+2 adjacent to the $n^{th}$-stage driving unit GDn. FIG. 1D is a signal timing diagram of the device substrate of FIG. 1A. FIG. 1D shows a timing diagram of the power line VSS, one data line DLn of the plurality of data lines DL1-DLy, a signal line STV1, a signal line STV2, a signal line STV3, a signal line STV4, eight high-frequency clock signal lines HC1-HC8, a first low-frequency clock signal line LC1, and a second low-frequency clock signal line LC2. Waveform of each signal in FIG. 1D is indicated by the unit of width W; however, the waveforms of the respective signal lines in the present invention are not limited to the waveforms of FIG. 1D.

Figure 2A:
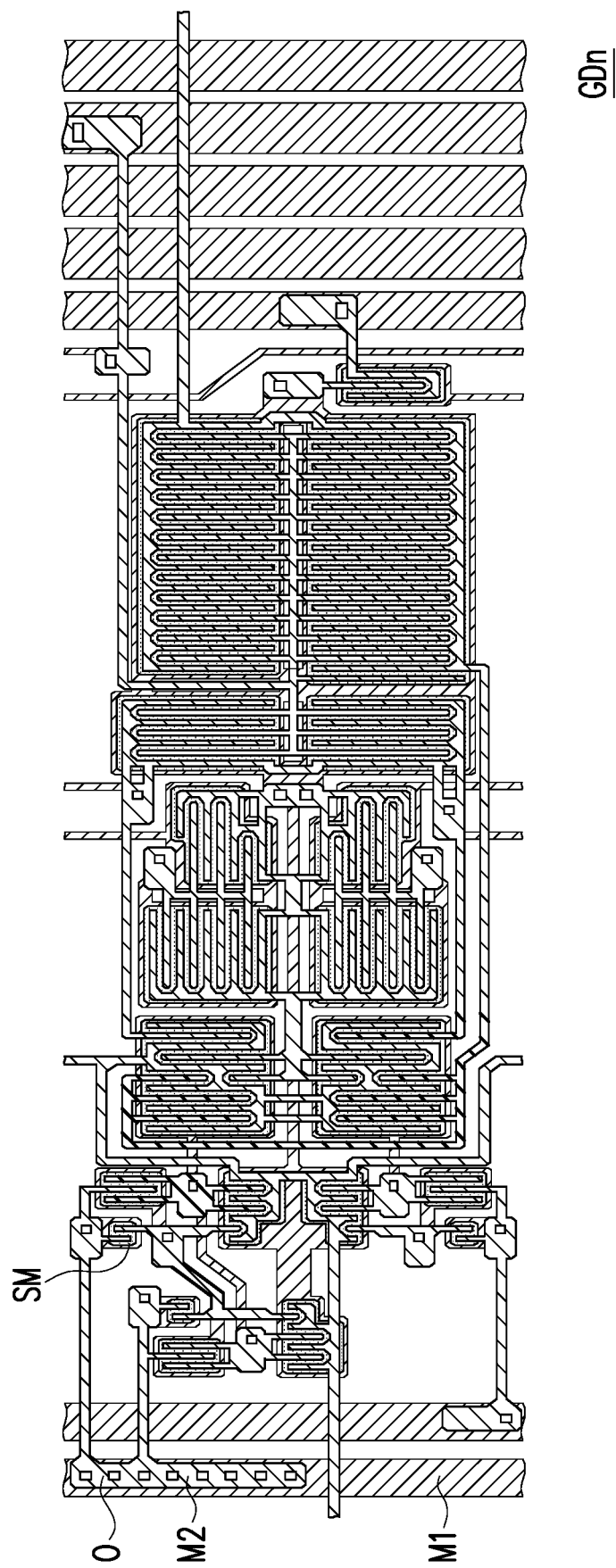
FIG. 2A is a schematic partial enlargement of FIG. 1A.
Figure 2B:
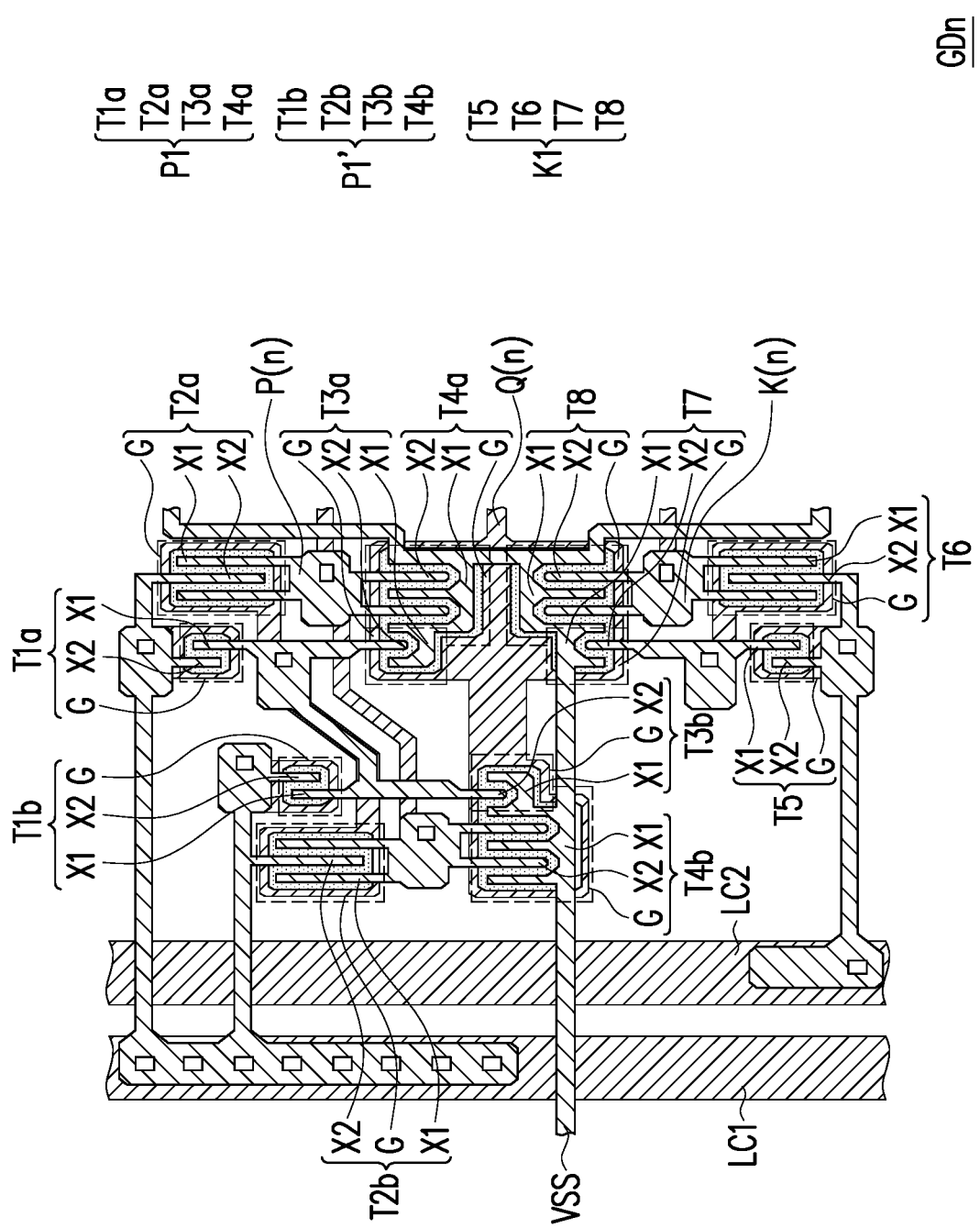
FIG. 2B to FIG. 2D are schematic partial enlargements of different areas of FIG. 2A respectively.
Figure 2C:
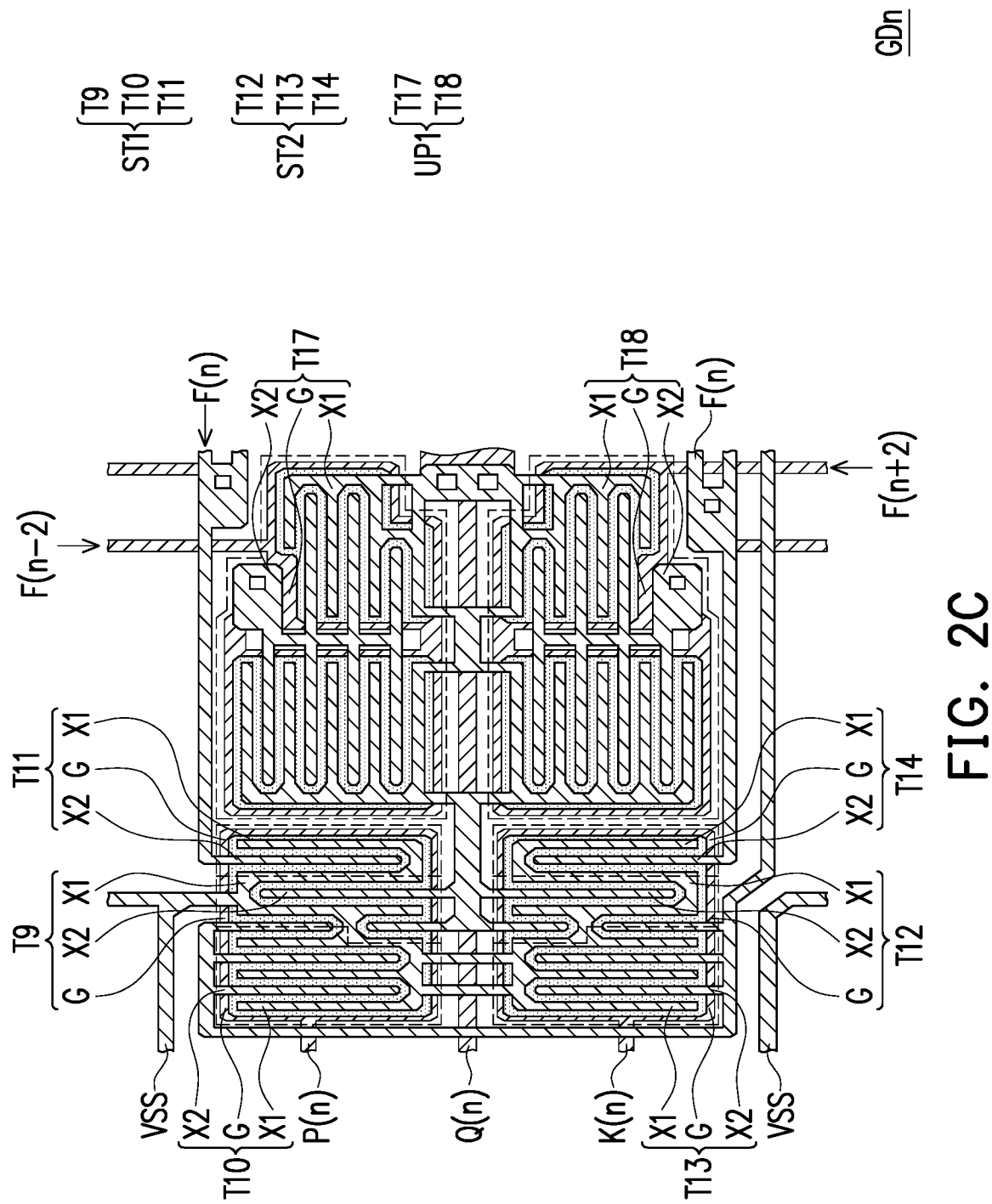
Figure 2D:
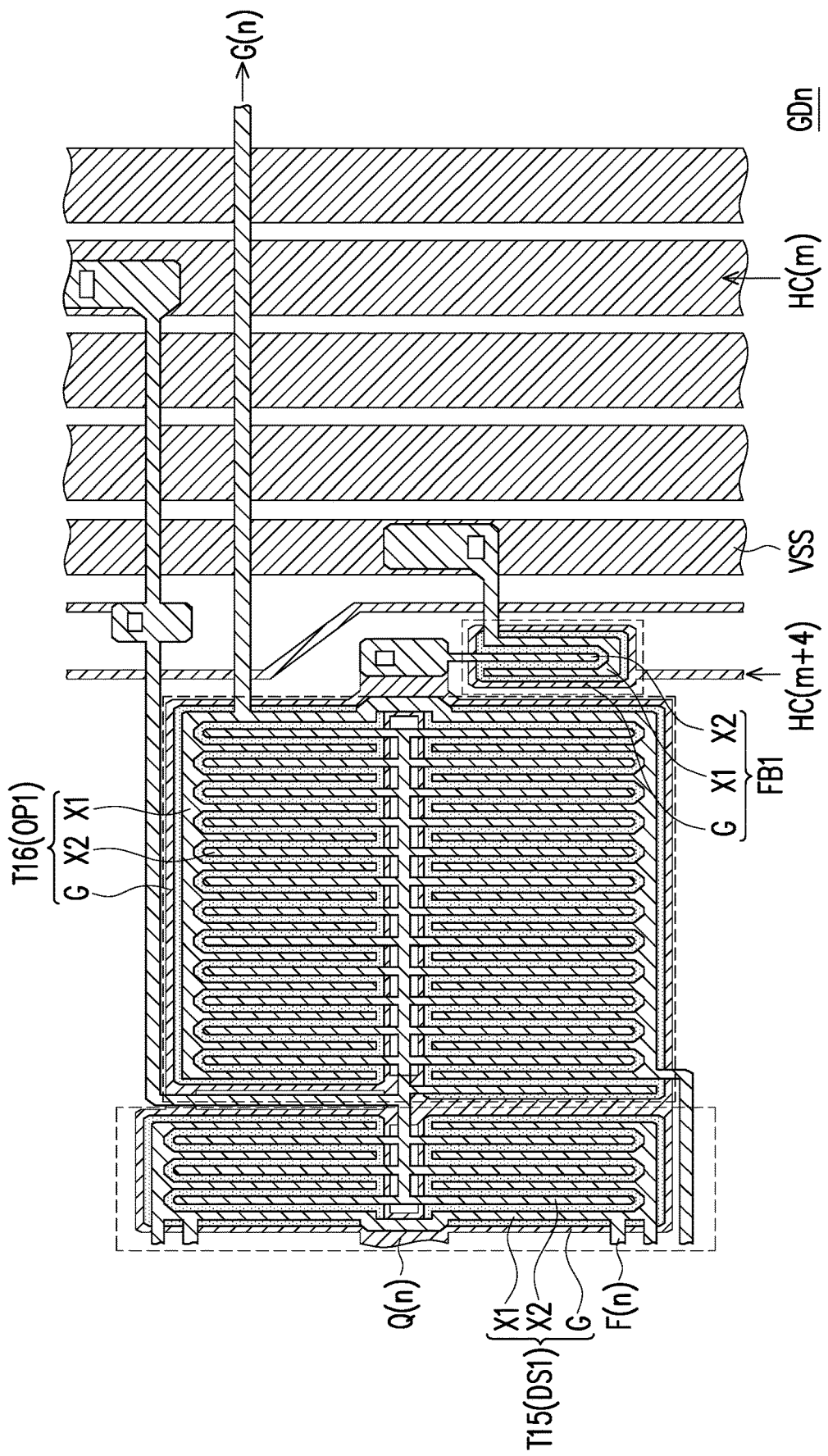

FIG. 2A is a schematic partial enlargement of FIG. 1A. FIG. 2B to FIG. 2D are schematic partial enlargements of different areas of FIG. 2A respectively. FIG. 2A to FIG. 2D illustrate schematic top views of the $n^{th}$-stage driving unit GDn.

Referring to FIG. 1C and FIG. 2A to FIG. 2D, a first active device T1a, a second active device T2a, a third active device T3a, a fourth active device T4a, a first active device T1b, a second active device T2b, a third active device T3b, a fourth active device T4b, a fifth active device T5, a sixth active device T6, a seventh active device T7, an eighth active device T8, a ninth active device T9, a tenth active device T10, an eleventh active device T11, a twelfth active device T12, a thirteenth active device T13, a fourteenth active device T14, a fifteenth active device T15, a sixteenth active device T16, a seventeenth active device T17, an eighteenth active device T18, and a first feedback device FB1 respectively include a control terminal G, a first terminal X1 and a second terminal X2. The control terminal G is, for example, belonging to a first metal layer M1 (a lowermost film layer in FIG. 2A). The first terminal X1 and the second terminal X2 are, for example, belonging to a second metal layer M2 (an uppermost film layer in FIG. 2A). A semiconductor pattern layer SM is interposed between the second metal layer M2 and the first metal layer M1. A gate insulating layer (not illustrated) is interposed between the first metal layer M1 and the semiconductor pattern layer SM. A portion of the second metal layer M2 is electrically connected with the first metal layer M1 through an opening O. The opening O penetrates at least the gate insulating layer. In a normal direction of the substrate 100, the substrate 100, the first metal layer M1, the gate insulating layer (not illustrated), the semiconductor pattern layer SM, and the second metal layer M2 are arranged sequentially, but the present invention is not limited thereto.

Referring to the $n^{th}$-stage driving unit GDn in FIG. 1C and FIG. 2A to FIG. 2D, the first auxiliary circuit P1 includes a first active device T1a, a second active device T2a, a third active device T3a, and a fourth active device T4a.

The control terminal G of the first active device T1a and the second terminal X2 of the first active device T1a are electrically connected with the first low-frequency clock signal line LC1. The first terminal X1 of the first active device T1a is electrically connected with the control terminal G of the second active device T2a and the second terminal X2 of the third active device T3a.

The second terminal X2 of the second active device T2a is electrically connected with the first low-frequency clock signal line LC1. The first terminal X1 of the second active device T2a and the second terminal X2 of the fourth active device T4a are electrically connected with a P(n) point.

The control terminal G of the third active device T3a and the control terminal G of the fourth active device T4a are electrically connected with a Q(n) point. The first terminal X1 of the third active device T3a and the first terminal X1 of the fourth active device T4a are electrically connected with the power line VSS.

The first backup circuit P1' includes a first active device T1b, a second active device T2b, a third active device T3b, and a fourth active device T4b.

The control terminal G of the first active device T1b and the second terminal X2 of the first active device T1b are electrically connected with the first low-frequency clock signal line LC1. The first terminal X1 of the first active device T1b is electrically connected with the control terminal G of the second active device T2b and the second terminal X2 of the third active device T3b.

The second terminal X2 of the second active device T2b is electrically connected with the first low-frequency clock signal line LC1. The first terminal X1 of the second active device T2b and the second terminal X2 of the fourth active device T4b are electrically connected with the P(n) point.

The control terminal G of the third active device T3b and the control terminal G of the fourth active device T4b are electrically connected with the Q(n) point. The first terminal X1 of the third active device T3b and the first terminal X1 of the fourth active device T4b are electrically connected with the power line VSS.

The first auxiliary circuit P1 and the first backup circuit P1' receive the same signal and transmit the same signal. For example, in the $n^{th}$-stage driving unit GDn, the first low-frequency clock signal line LC1 is electrically connected with the first auxiliary circuit P1 and the first backup circuit P1'. The first low-frequency clock signal line LC1 provides a first low-frequency clock signal to the first auxiliary circuit P1 and the first backup circuit P1'. In the present embodiment, in the $n^{th}$-stage driving unit GDn, the first auxiliary circuit P1 and the first backup circuit P1' are both used to receive the first low-frequency clock signal provided by the first low-frequency clock signal line LC1.

The second auxiliary circuit K1 includes a fifth active device T5, a sixth active device T6, a seventh active device T7, and an eighth active device T8.

In the $n^{th}$-stage driving unit GDn, the control terminal G of the fifth active device T5 and the second terminal X2 of the fifth active device T5 are electrically connected with the second low-frequency clock signal line LC2. The first terminal X1 of the fifth active device T5 is electrically connected with the control terminal G of the sixth active device T6 and the second terminal X2 of the seventh active device T7.

In the $n^{th}$-stage driving unit GDn, the second terminal X2 of the sixth active device T6 is electrically connected with the second low-frequency clock signal line LC2. The first terminal X1 of the sixth active device T6 and the second terminal X2 of the eighth active device T8 are electrically connected with a K(n) point.

The control terminal G of the seventh active device T7 and the control terminal G of the eighth active device T8 are electrically connected with the Q(n) point. The first terminal X1 of the seventh active device T7 and the first terminal X1 of the eighth active device T8 are electrically connected with the power line VSS.

The second auxiliary circuit K1 and the first auxiliary circuit P1 respectively receive reverse signals. For example, in the $n^{th}$-stage driving unit GDn, the second low-frequency clock signal line LC2 is electrically connected with the second auxiliary circuit K1, and provides a second low-frequency clock signal to the second auxiliary circuit K1. The first low-frequency clock signal line LC1 is electrically connected with the first auxiliary circuit P1, and provides a first low-frequency clock signal to the first auxiliary circuit P1. The first clock signal and the second clock signal are reverse signals, and in other words, the first clock signal and the second clock signal are reverse to each other as shown in FIG. 1D.

The first voltage stabilizing circuit ST1 includes a ninth active device T9, a tenth active device T10 and an eleventh active device T11.

The control terminal G of the ninth active device T9, the control terminal G of the tenth active device T10 and the control terminal G of the eleventh active device T11 are electrically connected with the P(n) point. The first terminal X1 of the ninth active device T9, the first terminal X1 of the tenth active device T10 and the first terminal X1 of the eleventh active device T11 are electrically connected with the power line VSS. The second terminal X2 of the ninth active device T9 is electrically connected with the Q(n) point.

The second terminal X2 of the tenth active device T10 is electrically connected with an output terminal of the first output circuit OP1. The output terminal of the first output circuit OP1 of the $n^{th}$-stage gate driving circuit is suitable for outputting an $n^{th}$-stage gate signal G(n).

The second terminal X2 of the eleventh active device T11 is electrically connected with an output terminal of the first downlink circuit DS1. The output terminal of the first downlink circuit DS1 of the $n^{th}$-stage gate driving circuit is suitable for outputting an $n^{th}$-stage downlink signal F(n).

The second voltage stabilizing circuit ST2 includes a twelfth active device T12, a thirteenth active device T13 and a fourteenth active device T14.

The control terminal G of the twelfth active device T12, the control terminal G of the thirteenth active device T13 and the control terminal G of the fourteenth active device T14 are electrically connected with the K(n) point. The first terminal X1 of the twelfth active device T12, the first terminal X1 of the thirteenth active device T13 and the first terminal X1 of the fourteenth active device T14 are electrically connected with the power line VSS. The second terminal X2 of the twelfth active device T12 is electrically connected with the Q(n) point.

The second terminal X2 of the thirteenth active device T13 is electrically connected with the output terminal of the first output circuit OP1.

The second terminal X2 of the fourteenth active device T14 is electrically connected with the output terminal of the first downlink circuit DS1.

The first downlink circuit DS1 includes a fifteenth active device T15. The control terminal G of the fifteenth active device T15 is electrically connected with the Q(n) point. The first terminal X1 of the fifteenth active device T15 serves as the output terminal of the first downlink circuit DS1 to output the $n^{th}$-stage downlink signal F(n). The second terminal X2 of the fifteenth active device T15 is electrically connected with a high-frequency clock signal line to receive a high-frequency clock signal HC(m).

The first output circuit OP1 includes a sixteenth active device T16. The control terminal G of the sixteenth active device T16 is electrically connected with the Q(n) point. The second terminal X2 of the sixteenth active device T16 is electrically connected with the high-frequency clock signal line to receive the high-frequency clock signal HC(m). The first terminal X1 of the sixteenth active device T16 serves as the output terminal of the first output circuit OP1 to output the $n^{th}$-stage gate signal G(n), thereby driving the corresponding scan line SLn.

The control terminal G of the first feedback device FB1 is electrically connected with the high-frequency clock signal line to receive a high-frequency clock signal HC(m+4). The first terminal X1 of the first feedback device FB1 is electrically connected with the power line VSS, and the second terminal X2 of the first feedback device FB1 is electrically connected with the Q(n) point.

In the present embodiment, the device substrate 10 includes eight high-frequency clock signal lines HC1-HC8 (as shown in FIG. 1D). The high-frequency clock signal HC(m) and the high-frequency clock signal HC(m+4) are respectively provided by two of the eight high-frequency clock signal lines HC1-HC8. In the present embodiment, referring to FIG. 1C, the high-frequency clock signal HC(m) received by the first output circuit OP1 of the $n^{th}$-stage driving unit GDn is different from a high-frequency clock signal HC(m+2) received by a second output circuit OP2 of the $(n+2)^{th}$-stage driving unit GDn+2. The high-frequency clock signal HC(m+4) received by the first feedback device FB1 of the $n^{th}$-stage driving unit GDn is different from a high-frequency clock signal line HC(m+6) received by the second feedback device FB2 of the $(n+2)^{th}$-stage driving unit GDn+2.

Next, a relationship between the first to eighth high-frequency clock signal lines HC1-HC8 and the corresponding high-frequency clock signals in the present embodiment will be described. A signal of a high-frequency clock signal HC(1+8i) is provided by the first high-frequency clock signal line HC1, where i is 0 and a positive integer, that is, i=0, 1, 2, 3, . . . . In other words, the high-frequency clock signals HC(1), HC(9), HC(17), . . . are all provided by the first high-frequency clock signal line HC1, and signal waveforms thereof are as shown by a waveform corresponding to HC1 in FIG. 1D. Similarly, a signal of a high-frequency clock signal HC(2+8i) is provided by the second high-frequency clock signal line HC2, a signal of a high-frequency clock signal HC(3+8i) is provided by the third high-frequency clock signal line HC3, a signal of a high-frequency clock signal HC(4+8i) is provided by the fourth high-frequency clock signal line HC4, a signal of a high-frequency clock signal HC(5+8i) is provided by the fifth high-frequency clock signal line HC5, a signal of a high-frequency clock signal HC(6+8i) is provided by the sixth high-frequency clock signal line HC6, a signal of a high-frequency clock signal HC(7+8i) is provided by the seventh high-frequency clock signal line HC7, and a signal of a high-frequency clock signal HC(8+8i) is provided by the eighth high-frequency clock signal line HC8. Signal waveforms thereof are as shown by waveforms respectively corresponding to HC2-HC8 in FIG. 1D, and the descriptions thereof are omitted herein. However, the present invention is not limited thereto. In other variations, the number of high-frequency clock signal lines may be reduced or increased depending on the demand, and the high-frequency clock signals respectively received by the output circuits and the feedback devices of the respective driving units are correspondingly adjusted.

For example, referring to FIG. 1A, FIG. 1C and FIG. 2D simultaneously, in the present embodiment, when n and m are both, for example, 9, a ninth-stage driving unit GD9 and an eleventh driving unit GD11 adjacent thereto are located in the gate driving circuit GD on the left side of the active area 110. The second terminal X2 of the sixteenth active device T16 of the first output circuit OP1 of the ninth-stage driving unit GD9 and the second terminal X2 of the fifteenth active device T15 of the first downlink circuit DS1 are, for example, electrically connected with the first high-frequency clock signal line HC1 to receive a high-frequency clock signal HC(9). The control terminal G of the first feedback device FB1 of the ninth-stage driving unit GD9 is, for example, electrically connected with the fifth high-frequency clock signal line HC5 to receive a high-frequency clock signal HC(13). The second terminal X2 of the sixteenth active device T16 of the second output circuit OP2 of the eleventh-stage driving unit GD11 and the second terminal X2 of the fifteenth active device T15 of the second downlink circuit DS2 are, for example, electrically connected with the third high-frequency clock signal line HC3 to receive a high-frequency clock signal HC(11). The control terminal G of the second feedback device FB2 of the eleventh-stage driving unit GD11 is, for example, electrically connected with the seventh high-frequency clock signal line HC7 to receive a high-frequency clock signal HC(15).

The voltage control circuit UP1 includes a seventeenth active device T17 and an eighteenth active device T18.

In the present embodiment, the voltage control circuit UP1 is a pull-up circuit. The control terminal G of the seventeenth active device T17 and the second terminal X2 of the seventeenth active device G17 receive a downlink signal F(n−2) provided by the (n−2)$^{th}$-stage driving unit GDn−2. In other words, the control terminal G and the second terminal X2 of the seventeenth active device G17 of the n$^{th}$-stage driving unit GDn are electrically connected with the first terminal X1 of the fifteenth active device G15 of the (n−2)$^{th}$-stage driving unit GDn−2. The first terminal X1 of the seventeenth active device T17 is electrically connected with the Q(n) point. Since there is no driving unit prior to the first two driving units, the control terminal G and the second terminal X2 of the seventeenth active device G17 of the first two driving units are electrically connected with other signal lines, respectively. For example, the signal line STV1 and the signal line STV2 (signal timings of the signal line STV1 and the signal line STV2 are illustrated in FIG. 1D) are electrically connected with the control terminal G and the second terminal X2 of the seventeenth active device G17 of the first two driving units, respectively.

The control terminal G of the eighteenth active device T18 and the second terminal X2 of the eighteenth active device T18 receive the downlink signal F(n+2) provided by the (n+2)$^{th}$-stage driving unit GDn+2. In other words, the second terminal X2 of the eighteenth active device T18 of the n$^{th}$-stage driving unit GDn is electrically connected with the first terminal X1 of the fifteenth active device G15 of the (n+2)$^{th}$-stage driving unit GDn+2. The first terminal X1 of the eighteenth active device T18 is electrically connected with the Q(n) point. Since there is no driving unit posterior to the last two driving units, the control terminal G and the second terminal X2 of the eighteenth active device T18 of the driving units of the last two driving units are electrically connected with other signal lines, respectively. For example, the signal line STV3 and the signal line STV4 (signal timings of the signal line STV3 and the signal line STV4 are illustrated in FIG. 1D) are electrically connected with the control terminal G and the second terminal X2 of the eighteenth active device T18 of the last two driving units, respectively.

Referring to FIG. 1C, in the present embodiment, each of the driving units in the device substrate 10 includes a backup circuit, and the driving units have similar structures. For example, the n$^{th}$-stage driving unit GDn (or referred to as the first driving unit) includes a first backup circuit P1', a first output circuit OP1, a first auxiliary circuit P1, a second auxiliary circuit K1, a first downlink circuit DS1, a first voltage stabilizing circuit ST1, a second voltage stabilizing circuit ST2, a first voltage control circuit UP1, and a first feedback device FB1. The (n+2)$^{th}$-stage driving unit GDn+2 (or referred to as the second driving unit) adjacent to the n$^{th}$-stage driving unit GDn includes a second backup circuit P2' a second output circuit OP2, a first auxiliary circuit P2, a second auxiliary circuit K2, a second downlink circuit DS2, a third voltage stabilizing circuit ST3, a fourth voltage stabilizing circuit ST4, a second voltage control circuit UP2, and a second feedback device FB2. Similar portions of the n$^{th}$-stage driving unit GDn and the (n+2)$^{th}$-stage driving unit GDn+2 are not described herein again.

In the (n+2)$^{th}$-stage driving unit GDn+2, the second backup circuit P2' is electrically connected with the first auxiliary circuit P2. The first auxiliary circuit P2 and the second backup circuit P2' are pull-up circuits or are pull-down circuits. The first auxiliary circuit P2 and the second backup circuit P2' receive the same signal and transmit the same signal. In other words, the second backup circuit P2' is a backup circuit of the first auxiliary circuit P2. The first auxiliary circuit P2 and the second backup circuit P2' have the same function.

In the present embodiment, the first low-frequency clock signal line LC1 is electrically connected with the first auxiliary circuit P1, the first backup circuit P1' and the second auxiliary circuit K2, and provides a first low-frequency clock signal to the first auxiliary circuit P1, the first backup circuit P1' and the second auxiliary circuit K2. The second low-frequency clock signal line LC2 is electrically connected with the first auxiliary circuit P2, the second backup circuit P2' and the second auxiliary circuit K1, and provides a second low-frequency clock signal to the first auxiliary circuit P2, the second backup circuit P2' and the second auxiliary circuit K1. The power line VSS is electrically connected with the first auxiliary circuit P1, the second auxiliary circuit K1, the first auxiliary circuit P2, the second auxiliary circuit K2, the first backup circuit P1', and the second backup circuit P2'.

Figure 3A:
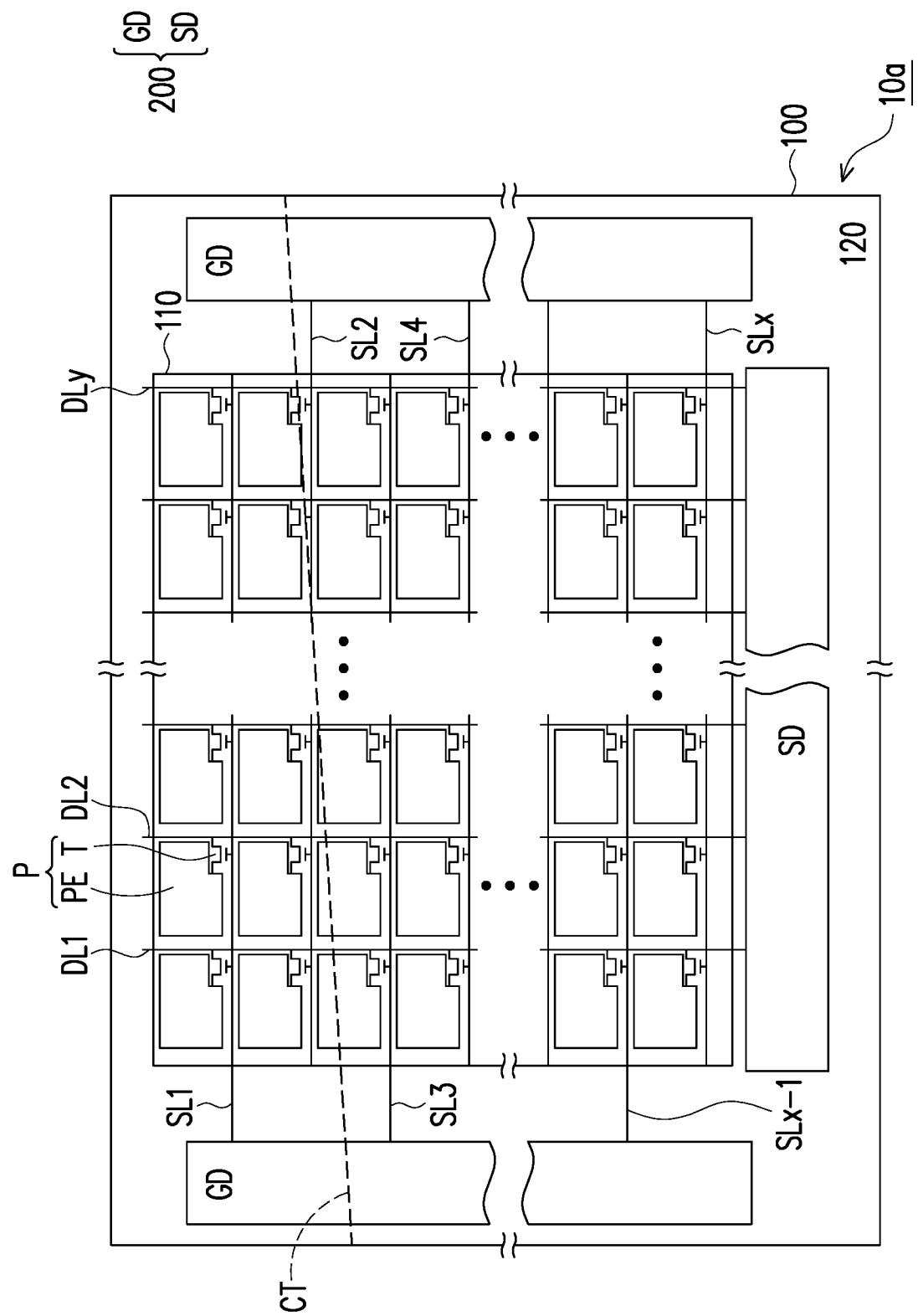
FIG. 3A is a schematic top view of a device substrate according to an embodiment of the present invention.
Figure 3B:
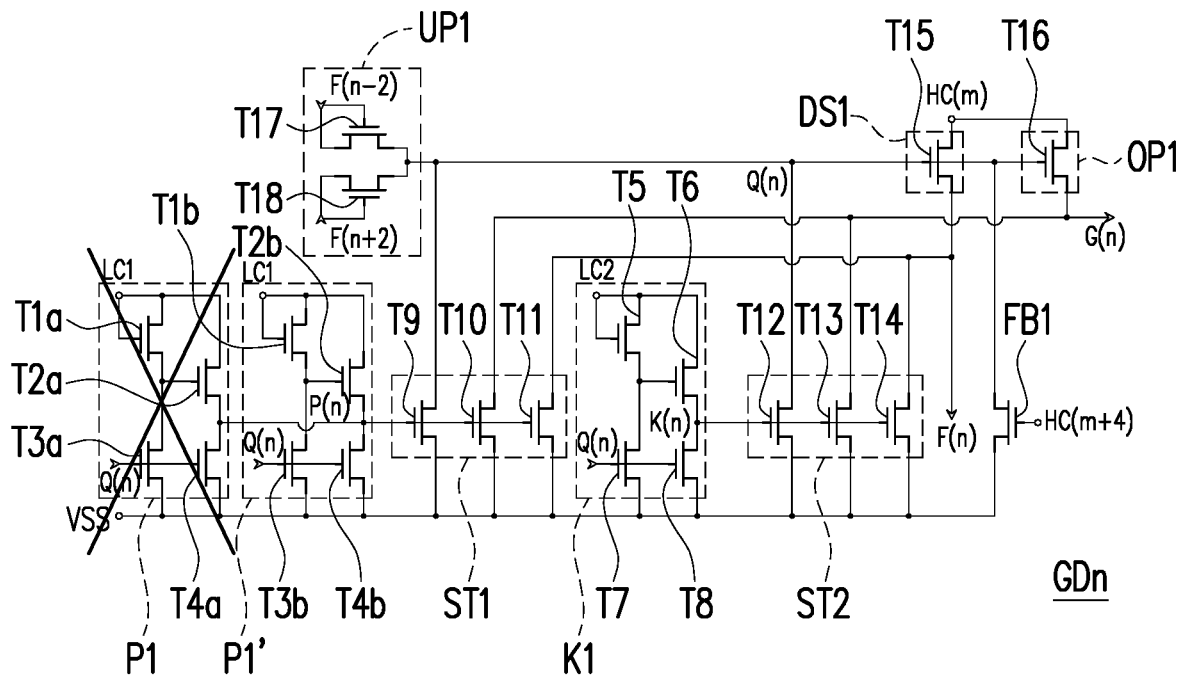
FIG. 3B is a schematic partial circuit of the device substrate of FIG. 3A.
Figure 3B:
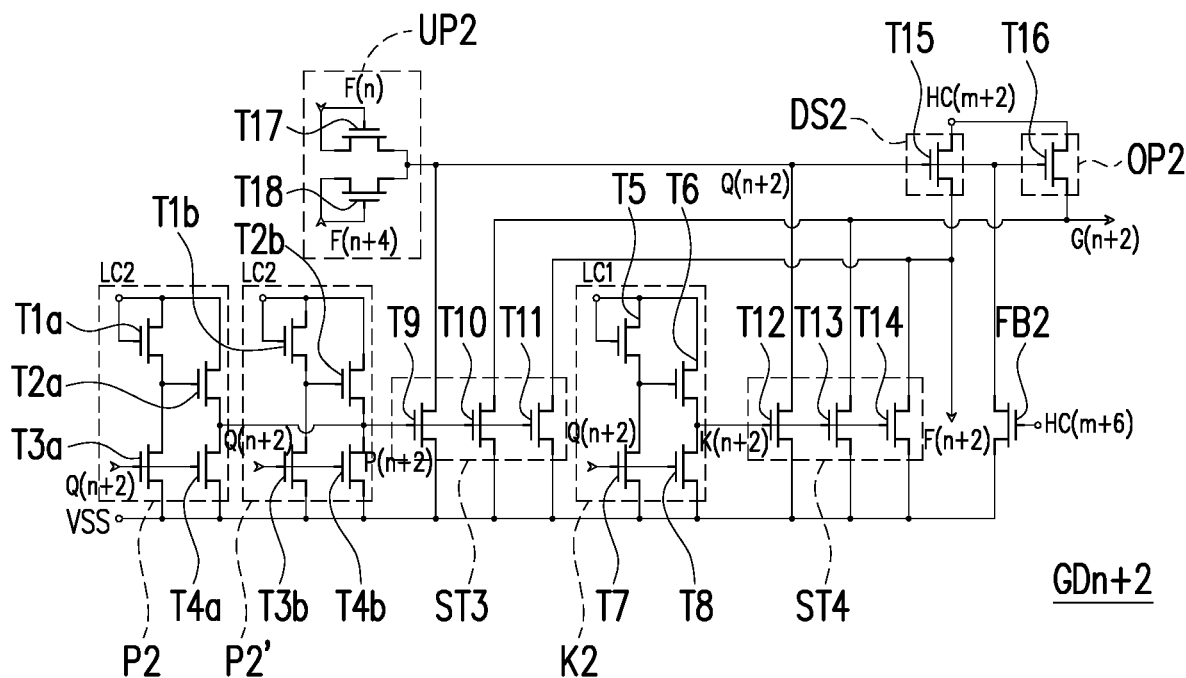
Figure 4A:
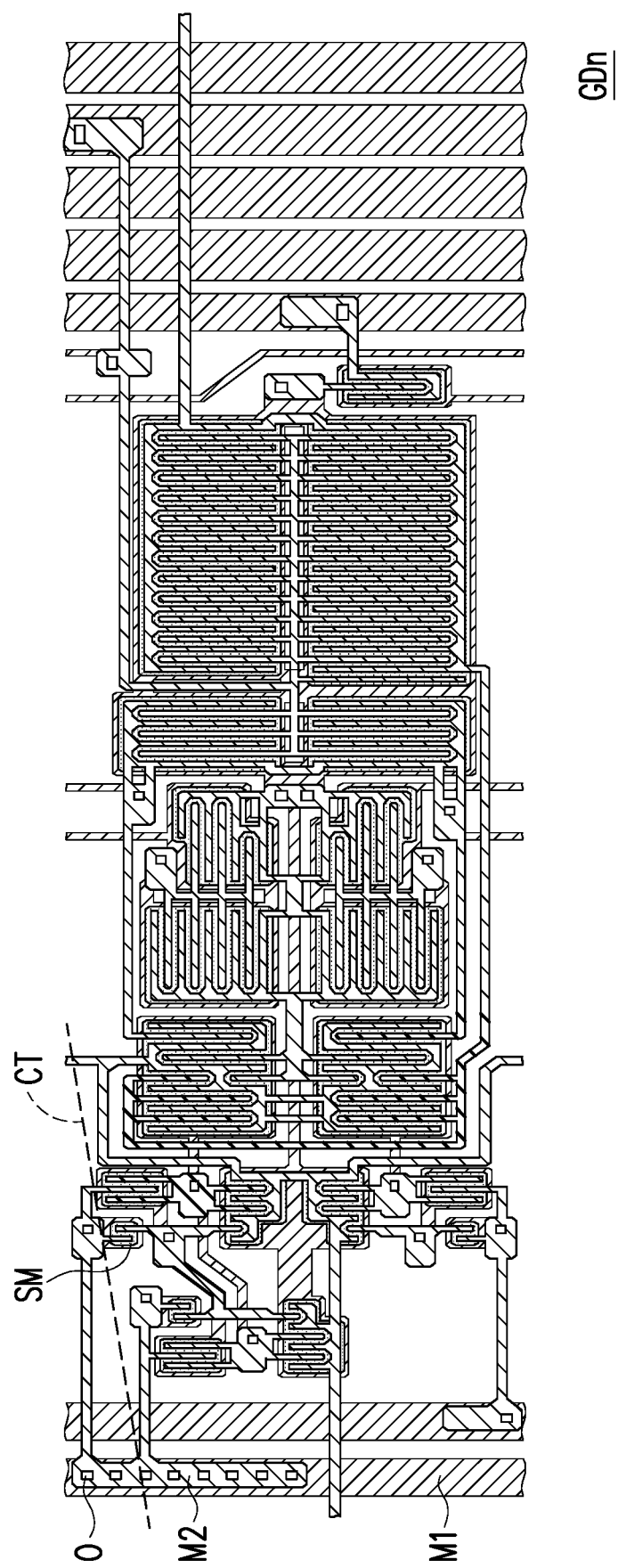
FIG. 4A is a schematic partial enlargement of FIG. 3A.
Figure 4B:
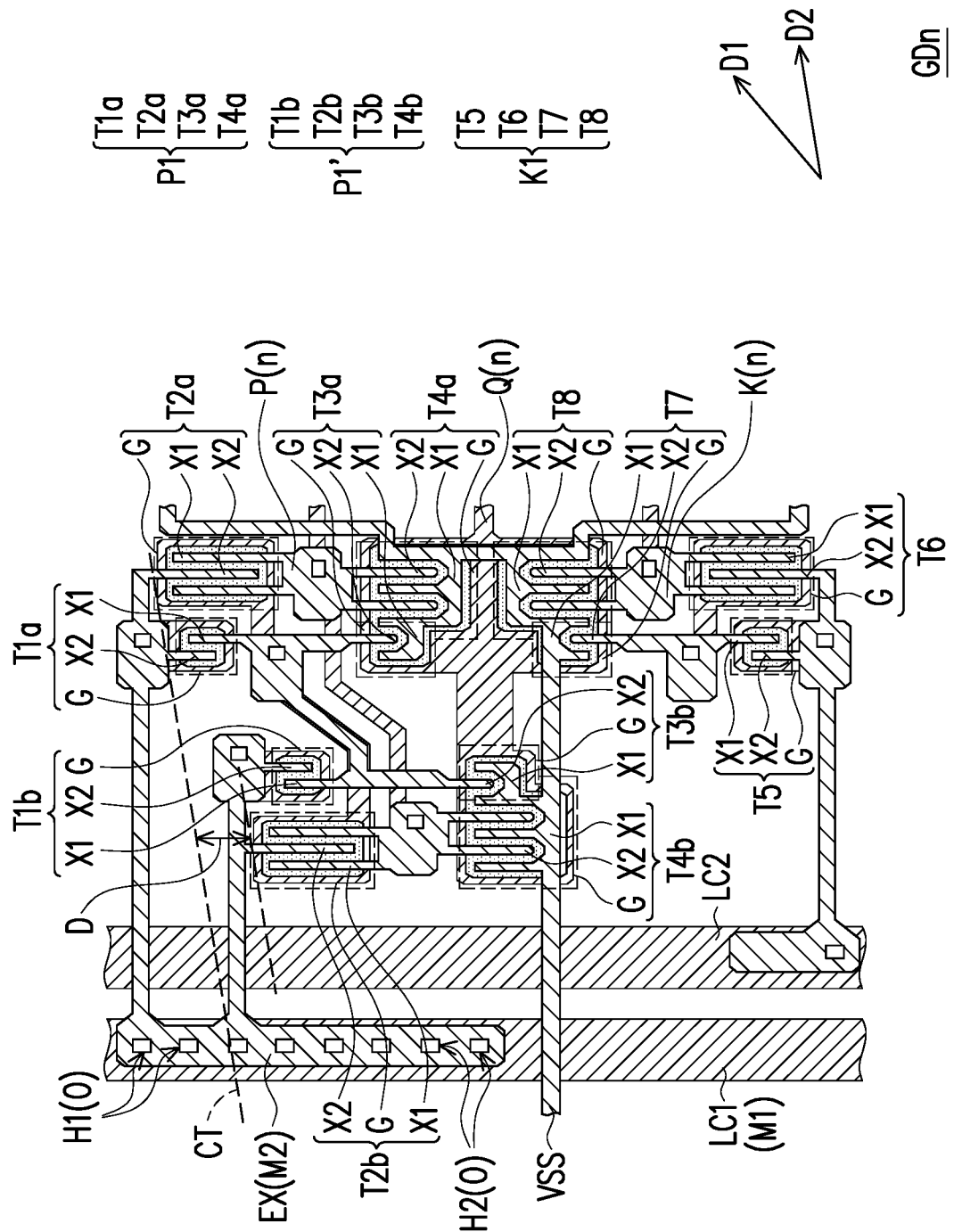
FIG. 4B is a schematic partial enlargement of FIG. 4A.

FIG. 3A is a schematic top view of a device substrate according to an embodiment of the present invention. FIG. 3B is a schematic partial circuit of the device substrate of FIG. 3A. FIG. 4A is a schematic partial enlargement of FIG. 3A. FIG. 4B is a schematic partial enlargement of FIG. 4A.

Referring to FIG. 3A, FIG. 3B, FIG. 4A, and FIG. 4B, the device substrate 10 is cut along a cutting path CT to form two new device substrates, one of which is a device substrate 10a at the lower side of the cutting path CT as shown in FIG. 3A. The cutting path CT overlaps the active area 110 and the peripheral area 120. When the cutting path CT overlaps the first auxiliary circuit P1, the first auxiliary circuit P1 is damaged after the cutting, as shown in FIG. 3B, FIG. 4A and FIG. 4B.

In the present embodiment, referring to FIG. 4B, an arrangement direction D1 of the first active device T1a of the first backup circuit P1 and the first active device T1*b* of the first backup circuit P1' is different from an extension direction D2 of the cutting path CT. The first backup circuit P1' does not overlap the cutting path CT. The shortest distance D between the first backup circuit P1' and the cutting path CT is from 125 microns to 300 microns. In the present embodiment, the shortest distance D refers to the distance between the cutting path CT and the closest one of the first active device T1*b*, the second active device T2*b*, the third active device T3*b*, and the fourth active device T4*b*.

Referring to FIG. 4B, an extension portion EX is electrically connected with the first low-frequency clock signal line LC1 via a plurality of openings O. The plurality of openings O may be substantially arranged in the extension direction of the first low-frequency clock signal line LC1. The plurality of openings O are overlapped with the extension portion EX and the first low-frequency clock signal line LC1. An extension direction of the extension portion EX is substantially the same as the extension direction of the first low-frequency clock signal line LC1. The first low-frequency clock signal line LC1 may transmit a low-frequency clock signal to the first active device T1*a* of the first backup circuit P1 and the first active device T1*b* of the first backup circuit P1' via the openings O. The extension portion EX is, for example, belonging to the second metal layer M2. After the device substrate 10 is cut by the cutting path CT, two new device substrates are formed, one of which is the device substrate 10*a*. The openings O may be defined as first openings H1 and second openings H2 respectively located on two opposite sides of the cutting path CT. The first active device T1*a* of the first auxiliary circuit P1 is damaged after the cutting, so the first auxiliary circuit P1 cannot function normally. The first backup circuit P1' is, for example, electrically connected with the first low-frequency clock signal line LC1 not via the first openings H1. The first backup circuit P1' receives a low-frequency clock signal from the first low-frequency clock signal line LC1 via the extension portion EX and at least one second opening H2. Since the first backup circuit P1' and the first auxiliary circuit P1 receive the same signal (a first low-frequency clock signal provided by the first low-frequency clock signal line LC1), even if the first auxiliary circuit P1 is damaged, the first low-frequency clock signal provided by the first low-frequency clock signal line LC1 may still be transferred to the first backup circuit P1', so that the $n^{th}$-stage driving unit GDn may operate, thereby increasing the yield of a cutting process of the device substrate 10*a*. In addition, the device substrate 10*a* having high flexible dimension choices may be obtained by shape cutting.

Figure 5A:
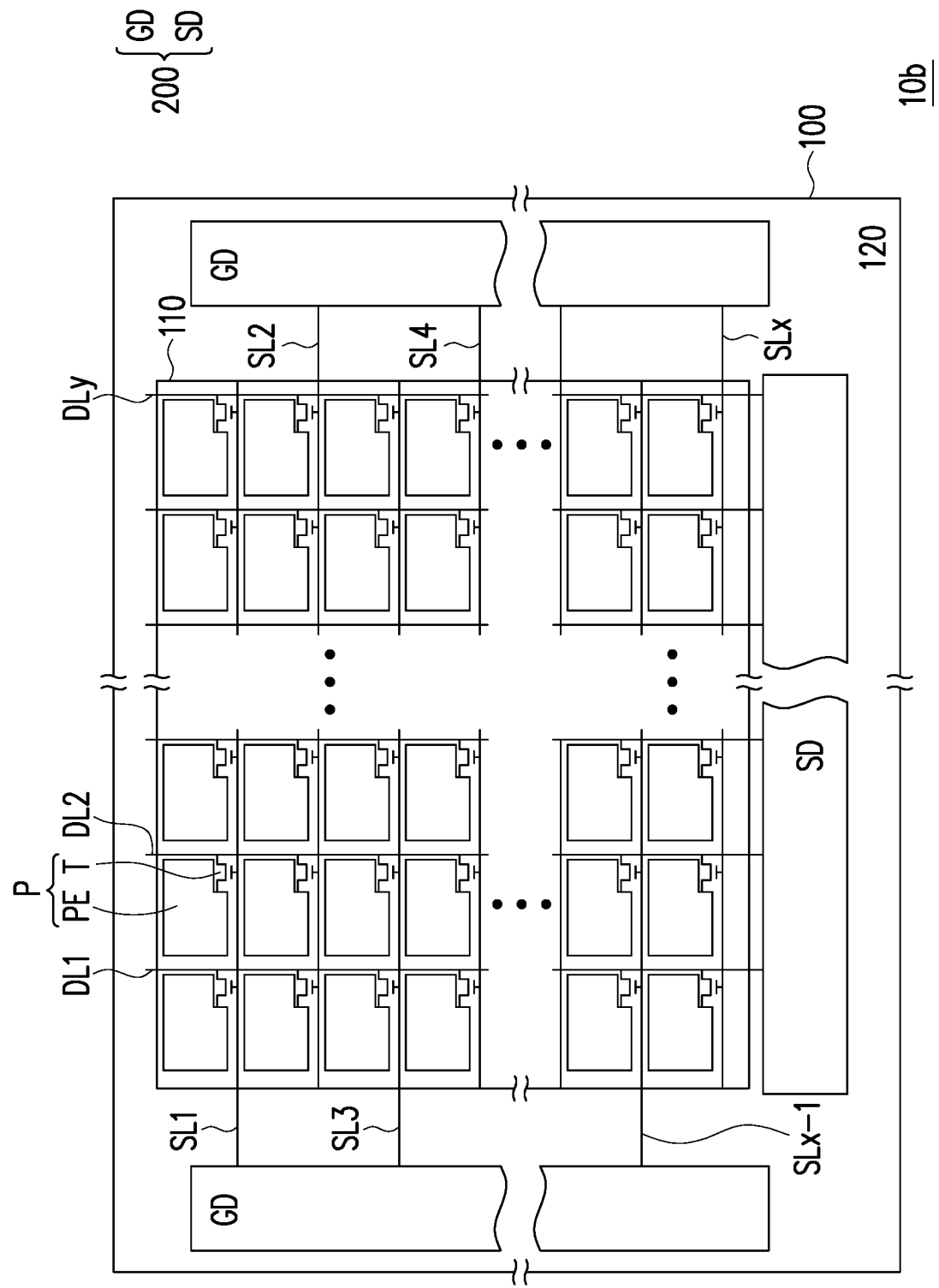
FIG. 5A is a schematic top view of a device substrate according to an embodiment of the present invention.
Figure 5B:
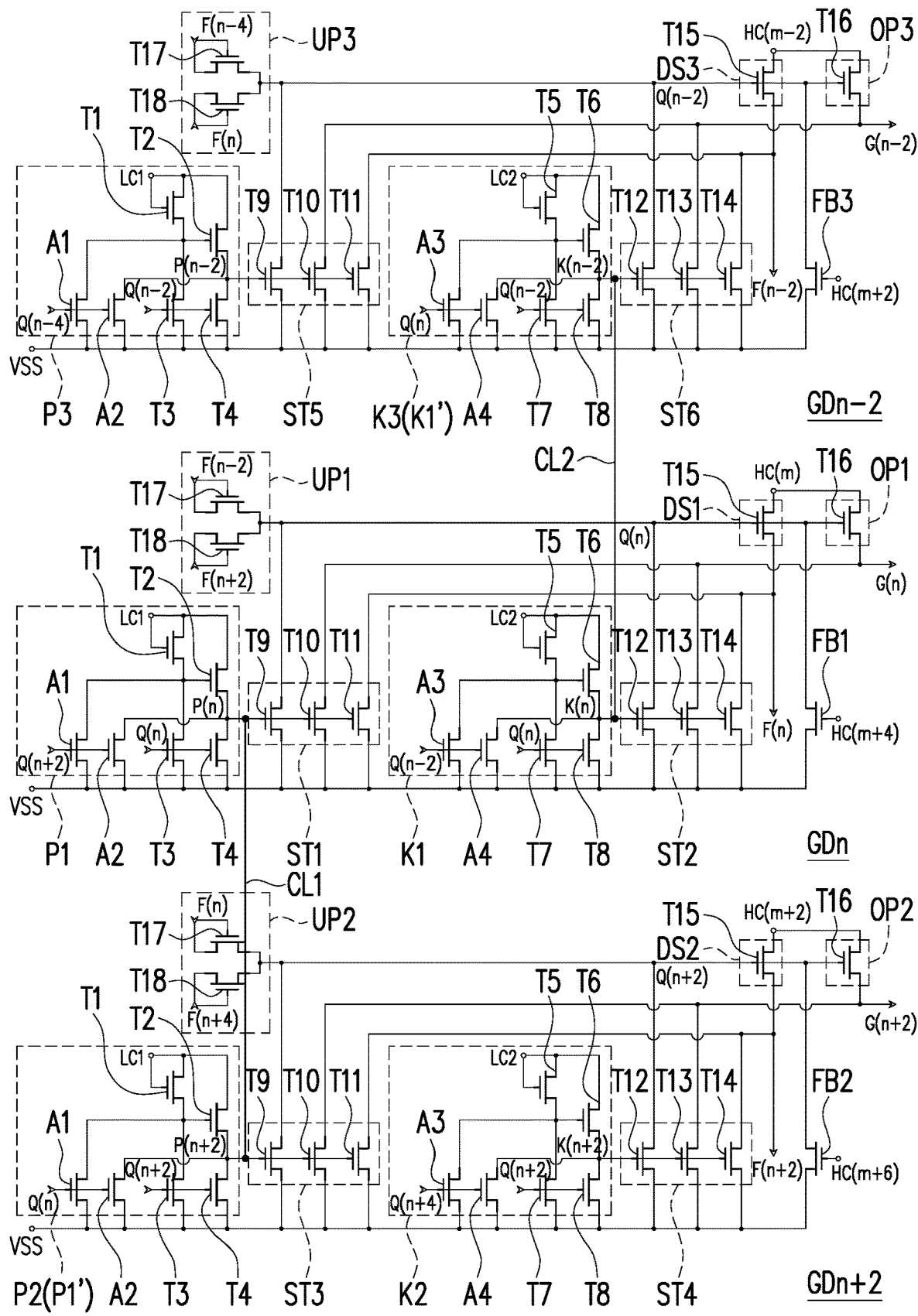
FIG. 5B is a schematic partial circuit of the device substrate of FIG. 5A.
Figure 6A:
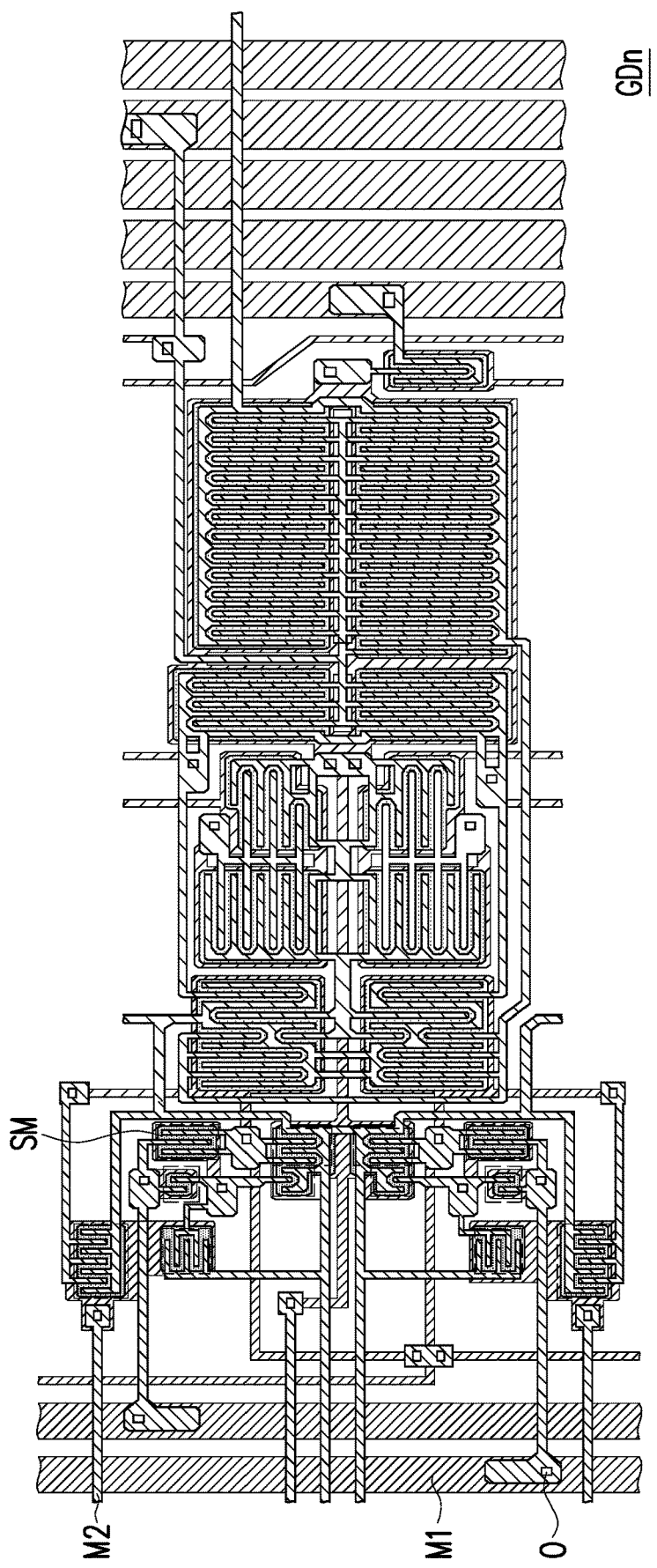
FIG. 6A is a schematic partial enlargement of FIG. 5A.
Figure 6B:
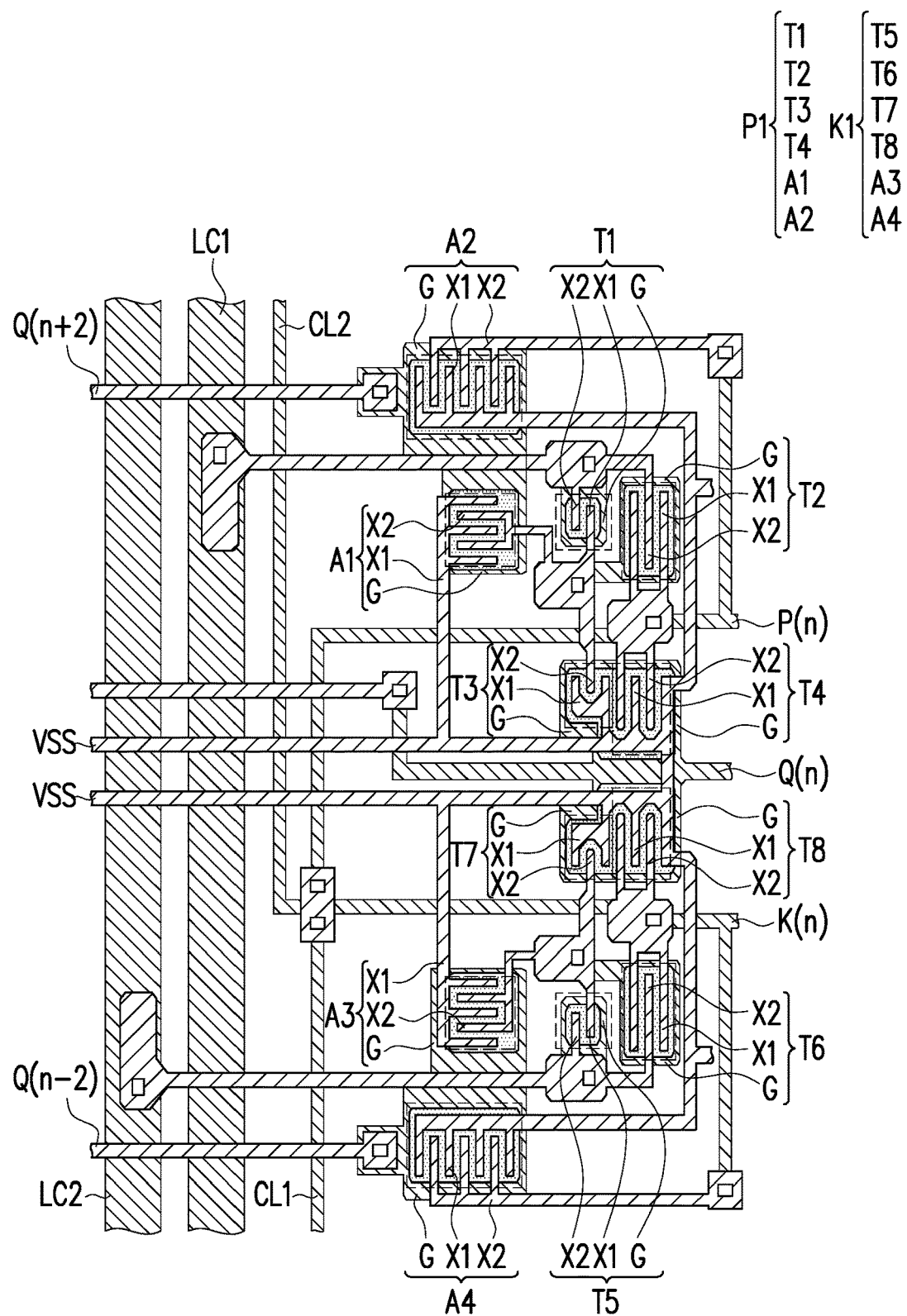
FIG. 6B to FIG. 6D are schematic partial enlargements of different areas of FIG. 6A respectively.
Figure 6C:
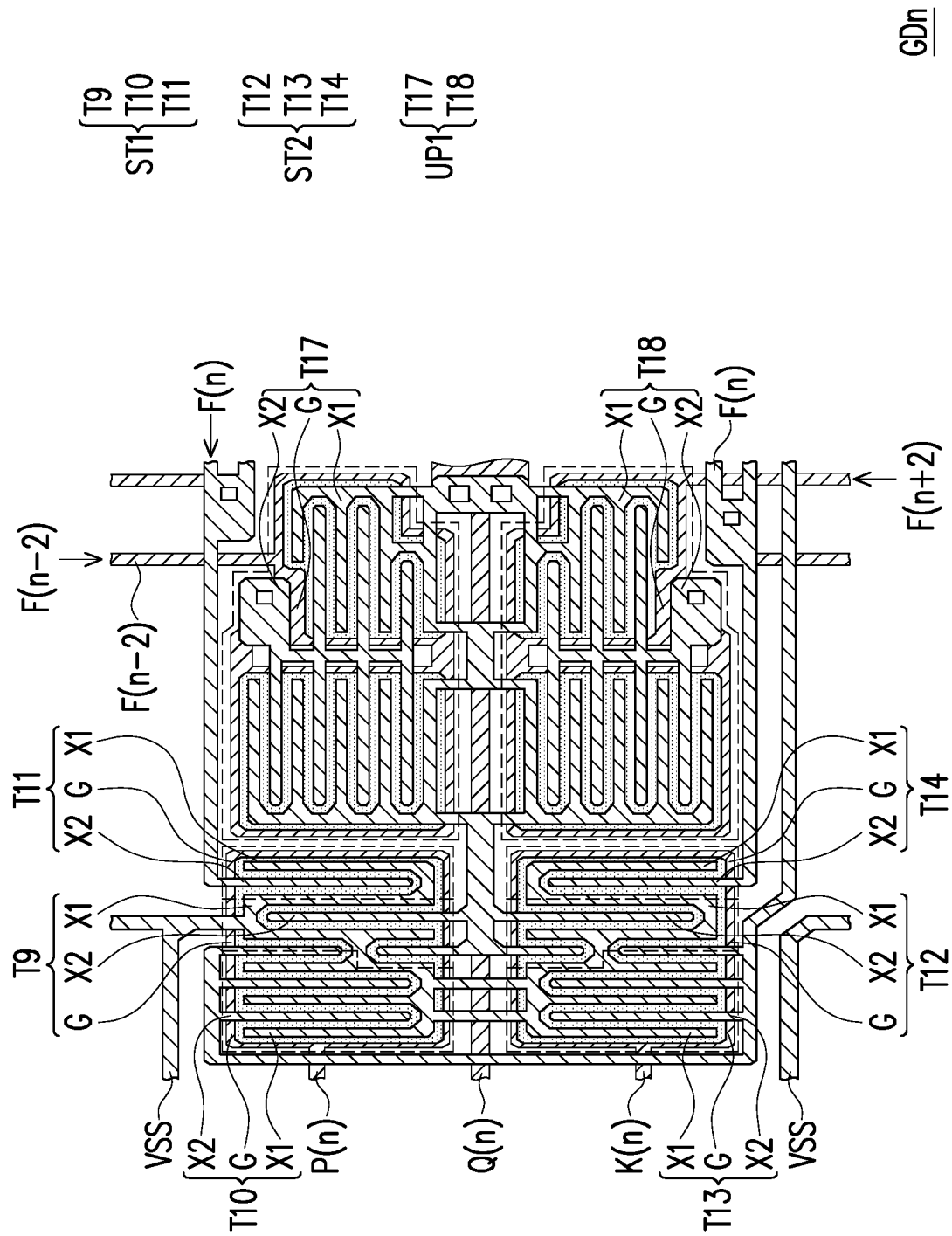
Figure 6D:
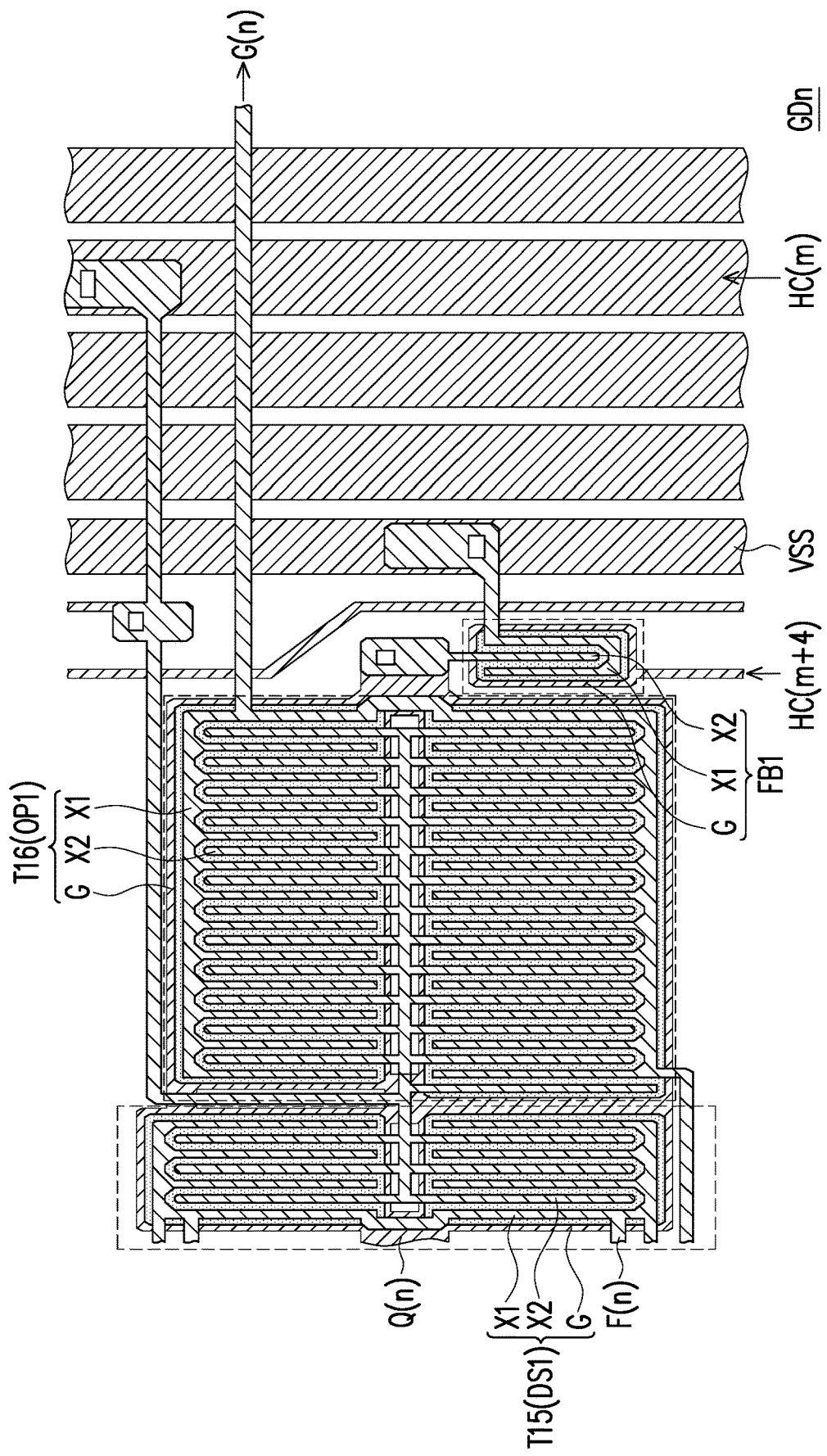

FIG. 5A is a schematic top view of a device substrate according to an embodiment of the present invention. FIG. 5B is a schematic partial circuit of the device substrate of FIG. 5A. FIG. 6A is a schematic partial enlargement of FIG. 5A. FIG. 6B to FIG. 6D are schematic partial enlargements of different areas of FIG. 6A respectively. It is to be noted that the embodiments of FIG. 5A, FIG. 5B, FIG. 6A, and FIG. 6B follow the device numbers and partial contents of the embodiments of FIG. 1A to FIG. 1D and FIG. 2A to FIG. 2D, where the same or similar reference numerals are used to represent the same or similar devices, and the description of the same technical content is omitted. For the description of the omitted portions, reference may be made to the foregoing embodiments, and the descriptions thereof are omitted herein.

The main difference between a device substrate 10*b* of FIG. 5A and the device substrate 10 of FIG. 1A is that, in the device substrate 10*b*, the first output circuit OP1, the first auxiliary circuit P1 and the second auxiliary circuit K1 are located in the $n^{th}$-stage driving unit GDn (first driving unit), and the second output circuit OP2 and the first backup circuit P1' (the third auxiliary circuit P2) are located in the (n+2)$^{th}$-stage driving unit GDn+2 (second driving unit).

Referring to FIG. 5A, FIG. 5B and FIG. 6A, the $(n-2)^{th}$-stage driving unit GDn−2, the $n^{th}$-stage driving unit GDn and the $(n+2)^{th}$-stage driving unit GDn+2 are, for example, located in the peripheral area 120 on the left side of the active area 110, sequentially arranged, and electrically connected. The $n^{th}$-stage driving unit GDn is located between the $(n-2)^{th}$-stage driving unit GDn−2 and the $(n+2)^{th}$-stage driving unit GDn+2. The $n^{th}$-stage driving unit GDn is adjacent to the $(n-2)^{th}$-stage driving unit GDn−2 and the $(n+2)^{th}$-stage driving unit GDn+2. In the present embodiment, three driving units arranged sequentially form one group. Each group includes a first connection line CL1 and a second connection line CL2. Every two groups are not electrically connected through the first connection line CL1 or the second connection line CL2. For example, three driving units such as the $(n-2)^{th}$-stage driving unit, the $n^{th}$-stage driving unit and the $(n+2)^{th}$-stage driving unit constitute a first group; three driving units such as the $(n+4)^{th}$-stage driving unit, the $(n+6)^{th}$-stage driving unit and the $(n+8)^{th}$-stage driving unit constitute a second group, and so on. The first group and the second group are not electrically connected through the first connection line CL1 or the second connection line CL2, other driving units are not provided between the first group and the second group (or two adjacent groups), but the present invention is not limited thereto. In other variations, each group may include more than three driving units, and/or at least one driving unit may be provided between two adjacent groups and is not belonging to any group. In other words, at least one driving unit is not connected with the first connection line CL1 or the second connection line CL2. In other variations, two groups are electrically connected through only one of the first connection line CL1 and the second connection line CL2. The relationship and function of the first connection line CL1 or the second connection line CL2 with other devices will be described in detail hereinafter.

Continuing to refer to FIG. 5B, the $n^{th}$-stage driving unit GDn (or referred to as a first driving unit) includes a first output circuit OP1, a first auxiliary circuit P1, a second auxiliary circuit K1, a first downlink circuit DS1, a first voltage stabilizing circuit ST1, a second voltage stabilizing circuit ST2, a first voltage control circuit UP1, and a first feedback device FB1.

The $(n+2)^{th}$-stage driving unit GDn+2 (or referred to as a second driving unit) includes a first backup circuit P1' (or referred to as a first auxiliary circuit P2 of the $(n+2)^{th}$-stage driving unit GDn+2), a second output circuit OP2, a third auxiliary circuit (or referred to as a second auxiliary circuit K2 of the $(n+2)^{th}$-stage driving unit GDn+2), a second downlink circuit DS2, a third voltage stabilizing circuit ST3, a fourth voltage stabilizing circuit ST4, a second voltage control circuit UP2, and a second feedback device FB2.

The $(n-2)^{th}$-stage driving unit GDn−2 (or referred to as a third driving unit) includes a second backup circuit K1' (or referred to as a second auxiliary circuit K3 of the $(n-2)^{th}$-stage driving unit GDn−2), a third output circuit OP3, a fourth auxiliary circuit (or referred to as a first auxiliary circuit P3 of the $(n-2)^{th}$-stage driving unit GDn−2), a third downlink circuit DS3, a fifth voltage stabilizing circuit ST5, a sixth voltage stabilizing circuit ST6, a third voltage control circuit UP3, and a third feedback device FB3.

The power line VSS is electrically connected with the first auxiliary circuit P1, the second auxiliary circuit K1, the third auxiliary circuit (or referred to as the second auxiliary circuit K2 of the $(n+2)^{th}$-stage driving unit GDn+2), the fourth auxiliary circuit (or referred to as the first auxiliary circuit P3 of the $(n-2)^{th}$-stage driving unit GDn-2), the first backup circuit P1', and the second backup circuit K1'.

In the present embodiment, the first auxiliary circuit P1 of the $n^{th}$-stage driving unit GDn (first driving unit), the first backup circuit P1' of the $(n+2)^{th}$-stage driving unit GDn+2 (second driving unit) and the fourth auxiliary circuit (or referred to as the first auxiliary circuit P3 of the $(n-2)^{th}$-stage driving unit GDn-2) of the $(n-2)^{th}$-stage driving unit GDn-2 (third driving unit) respectively include a first active device T1, a second active device T2, a third active device T3, a fourth active device T4, a first switching device A1, and a second switching device A2.

The control terminal G of the first active device T1 and the second terminal X2 of the first active device T1 are electrically connected with the first low-frequency clock signal line LC1. The first terminal X1 of the first active device T1 is electrically connected with the control terminal G of the second active device T2, the second terminal X2 of the first switching device A1 and the second terminal X2 of the third active device T3.

The second terminal X2 of the second active device T2 is electrically connected with the first low-frequency clock signal line LC1. In the $n^{th}$-stage driving unit GDn, the first terminal X1 of the second active device T2, the second terminal X2 of the second switching device A2 and the second terminal X2 of the fourth active device T4 are electrically connected with a P(n) point. In the $(n+2)^{th}$-stage driving unit GDn+2, the first terminal X1 of the second active device T2, the second terminal X2 of the second switching device A2 and the second terminal X2 of the fourth active device T4 are electrically connected with a P(n+2) point. In the $(n-2)^{th}$-stage driving unit GDn-2, the first terminal X1 of the second active device T2, the second terminal X2 of the second switching device A2 and the second terminal X2 of the fourth active device T4 are electrically connected with a P(n-2) point.

The first terminal X1 of the first switching device A1, the first terminal X1 of the second switching device A2, the first terminal X1 of the third active device T3, and the first terminal X1 of the fourth active device T4 are electrically connected with the power line VSS.

In the first auxiliary circuit P1 of the $n^{th}$-stage driving unit GDn (first driving unit), the control terminal G of the third active device T3 and the control terminal G of the fourth active device T4 are electrically connected with a Q(n) point, and the control terminal G of the first switching device A1 and the control terminal G of the second switching device A2 are electrically connected with a Q(n+2) point, that is, the Q(n+2) point in the $(n+2)^{th}$-stage driving unit GDn+2 (second driving unit).

In the first backup circuit P1' (or referred to as the first auxiliary circuit P2 of the $(n+2)^{th}$-stage driving unit GDn+2) of the $(n+2)^{th}$-stage driving unit GDn+2 (second driving unit), the control terminal G of the third active device T3 and the control terminal G of the fourth active device T4 are electrically connected with the Q(n+2) point, and the control terminal G of the first switching device A1 and the control terminal G of the second switching device A2 are electrically connected with the Q(n) point, that is, the Q(n) point in the $n^{th}$-stage driving unit GD.

In the fourth auxiliary circuit (or referred to as the first auxiliary circuit P3 of the $(n-2)^{th}$-stage driving unit GDn-2) of the $(n-2)^{th}$-stage driving unit GDn-2 (third driving unit), the control terminal G of the third active device T3 and the control terminal G of the fourth active device T4 are electrically connected with a Q(n-2) point, and the control terminal G of the first switching device A1 and the control terminal G of the second switching device A2 are electrically connected with a Q(n-4) point, that is, the Q(n-4) point in the n-4th-stage driving unit GDn-4.

Continuing to refer to FIG. 5B, the first connection line CL1 electrically connects the first backup circuit P1' to the first auxiliary circuit P1. In the present embodiment, the first connection line CL1 electrically connects the P(n) point of the $n^{th}$-stage driving unit GDn (first driving unit) and the P(n+2) point of the $(n+2)^{th}$-stage driving unit GDn+2 (second driving unit). In other words, the output terminal of the first auxiliary circuit P1 of the $n^{th}$-stage driving unit GDn (first driving unit) is electrically connected with the output terminal of the first auxiliary circuit P2 of the $(n+2)^{th}$-stage driving unit GDn+2 (second driving unit). On the other hand, the control terminal G of the first switching device A1 of the first auxiliary circuit P1 of the $n^{th}$-stage driving unit GDn (first driving unit), the control terminal G of the second switching device A2, the control terminal G of the third active device T3 of the first auxiliary circuit P2 of the $(n+2)^{th}$-stage driving unit GDn+2 (second driving unit), and the control terminal G of the fourth active device T4 are all electrically connected with the Q(n+2) point. The control terminal G of the third active device T3 of the first auxiliary circuit P1 of the $n^{th}$-stage driving unit GDn (first driving unit), the control terminal G of the fourth active device T4, the control terminal G of the first switching device A1 of the first auxiliary circuit P2 of the $(n+2)^{th}$-stage driving unit GDn+2 (second driving unit), and the control terminal G of the second switching device A2 are all electrically connected with the Q(n) point. Therefore, the first auxiliary circuit P1 of the $n^{th}$-stage driving unit GDn (first driving unit) and the first auxiliary circuit P2 of the $(n+2)^{th}$-stage driving unit GDn+2 (second driving unit) may be controlled simultaneously by the same signal. The first backup circuit P1' and the first auxiliary circuit P1 are both pull-up circuits or are both pull-down circuits, and the first backup circuit P1' and the first auxiliary circuit P1 receive the same signal. In the present embodiment, the first backup circuit P1' and the first auxiliary circuit P1 are both pull-down circuits. The first low-frequency clock signal line LC1 is electrically connected with the first auxiliary circuit P1, the fourth auxiliary circuit (or referred to as the first auxiliary circuit P3 of the $(n-2)^{th}$-stage driving unit GDn-2) and the first backup circuit P1', and provides a first low-frequency clock signal to the first auxiliary circuit P1, the fourth auxiliary circuit (or referred to as the first auxiliary circuit P3 of the $(n-2)^{th}$-stage driving unit GDn-2) and the first backup circuit P1'.

In the present embodiment, the second auxiliary circuit K1 of the $n^{th}$-stage driving unit GDn (first driving unit), the third auxiliary circuit (or referred to as the second auxiliary circuit K2 of the $(n+2)^{th}$-stage driving unit GDn+2) of the $(n+2)^{th}$-stage driving unit GDn+2 (second driving unit) and the second backup circuit K1' (or referred to as the second auxiliary circuit K3 of the $(n-2)^{th}$-stage driving unit GDn-2) of the $(n-2)^{th}$-stage driving unit GDn-2 (third driving unit) respectively include a fifth active device T5, a sixth active device T6, a seventh active device T7, an eighth active device T8, a third switching device A3, and a fourth switching device A4.

The control terminal G of the fifth active device T5 and the second terminal X2 of the fifth active device T5 are electrically connected with the second low-frequency clock signal line LC2. The first terminal X1 of the fifth active device T5 is electrically connected with the control terminal G of the sixth active device T6, the second terminal X2 of the seventh active device T7 and the second terminal X2 of the third switching device A3. The second terminal X2 of the sixth active device T6 is electrically connected with the second low-frequency clock signal line LC2.

In the $n^{th}$-stage driving unit GDn, the first terminal X1 of the sixth active device T6, the second terminal X2 of the eighth active device T8 and the second terminal X2 of the fourth switching device A4 are electrically connected with a K(n) point. In the $(n+2)^{th}$-stage driving unit GDn+2, the first terminal X1 of the sixth active device T6, the second terminal X2 of the eighth active device T8 and the second terminal X2 of the fourth switching device A4 are electrically connected with a K(n+2) point. In the $(n-2)^{th}$-stage driving unit GDn−2, the first terminal X1 of the sixth active device T6, the second terminal X2 of the eighth active device T8 and the second terminal X2 of the fourth switching device A4 are electrically connected with a K(n−2) point.

The first terminal X1 of the seventh active device T7, the first terminal X1 of the eighth active device T8, the first terminal X1 of the third switching device A3, and the first terminal X1 of the fourth switching device A4 are electrically connected with the power line VSS.

In the second auxiliary circuit K1 of the $n^{th}$-stage driving unit GDn, the control terminal G of the seventh active device T7 and the control terminal G of the eighth active device T8 are electrically connected with the Q(n) point, and the control terminal G of the third switching device A3 and the control terminal G of the fourth switching device A4 are electrically connected with the Q(n−2) point.

In the third auxiliary circuit (or referred to as the second auxiliary circuit K2 of the $(n+2)^{th}$-stage driving unit GDn+2) of the $(n+2)^{th}$-stage driving unit GDn+2, the control terminal G of the seventh active device T7 and the control terminal G of the eighth active device T8 are electrically connected with the Q(n+2) point, and the control terminal G of the third switching device A3 and the control terminal G of the fourth switching device A4 are electrically connected with a Q(n+4) point, that is, the Q(n) point in the $(n+4)^{th}$-stage driving unit GDn+4.

In the second backup circuit K1' (or referred to as the second auxiliary circuit K3 of the $(n-2)^{th}$-stage driving unit GDn−2) of the $(n-2)^{th}$-stage driving unit GDn−2, the control terminal G of the seventh active device T7 and the control terminal G of the eighth active device T8 are electrically connected with the Q(n−2) point, and the control terminal G of the third switching device A3 and the control terminal G of the fourth switching device A4 are electrically connected with the Q(n) point.

The second connection line CL2 electrically connects the second backup circuit K1' to the second auxiliary circuit K1. In the present embodiment, the second connection line CL2 electrically connects the K(n) point of the $n^{th}$-stage driving unit GDn (first driving unit) and the K(n−2) point of the $(n-2)^{th}$-stage driving unit GDn−2 (third driving unit). In other words, the output terminal of the second auxiliary circuit K1 of the $n^{th}$-stage driving unit GDn (first driving unit) is electrically connected with the output terminal of the second auxiliary circuit K3 of the $(n-2)^{th}$-stage driving unit GDn−2 (third driving unit). On the other hand, the control terminal G of the third switching device A3 of the second auxiliary circuit K1 of the $n^{th}$-stage driving unit GDn (first driving unit), the control terminal G of the fourth switching device A4, the control terminal G of the seventh active device T7 of the second auxiliary circuit K3 of the $(n-2)^{th}$-stage driving unit GDn−2 (third driving unit), and the control terminal G of the eighth active device T8 are all electrically connected with the Q(n−2) point. The control terminal G of the seventh active device T7 of the second auxiliary circuit K1 of the $n^{th}$-stage driving unit GDn (first driving unit), the control terminal G of the eighth active device T8, the control terminal G of the third switching device A3 of the second auxiliary circuit K3 of the (n−2)$^{th}$-stage driving unit GDn−2 (third driving unit), and the control terminal G of the fourth switching device A4 are all electrically connected with the Q(n) point. Therefore, the second auxiliary circuit K1 of the $n^{th}$-stage driving unit GDn (first driving unit) and the second auxiliary circuit K3 of the $(n-2)^{th}$-stage driving unit GDn−2 (third driving unit) may be controlled simultaneously by the same signal. The second backup circuit K1' and the second auxiliary circuit K1 are both pull-up circuits or are both pull-down circuits, and the second backup circuit K1' and the second auxiliary circuit K1 receive the same signal and transmit the same signal. In the present embodiment, the second backup circuit K1' and the second auxiliary circuit K1 are both pull-down circuits. The second low-frequency clock signal line LC2 is electrically connected with the second auxiliary circuit K1, the third auxiliary circuit (or referred to as the second auxiliary circuit K2 of the $(n+2)^{th}$-stage driving unit GDn+2) and the second backup circuit K1', and provides a second low-frequency clock signal to the second auxiliary circuit K1, the third auxiliary circuit (or referred to as the second auxiliary circuit K2 of the $(n+2)^{th}$-stage driving unit GDn+2) and the second backup circuit K1'. The first low-frequency clock signal and the second low-frequency clock signal are reverse signals.

Figure 7A:
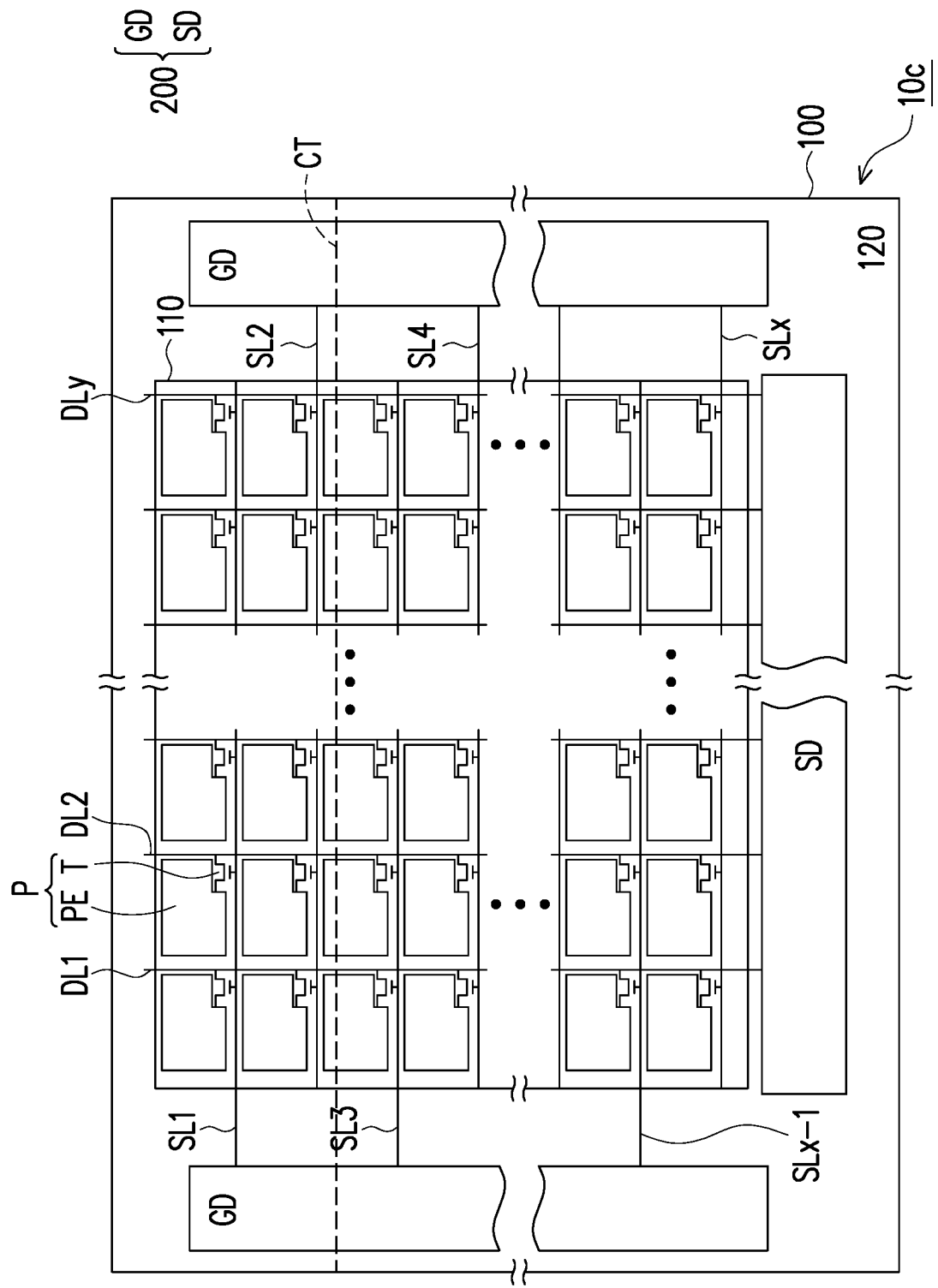
FIG. 7A is a schematic top view of a device substrate according to an embodiment of the present invention.
Figure 7B:
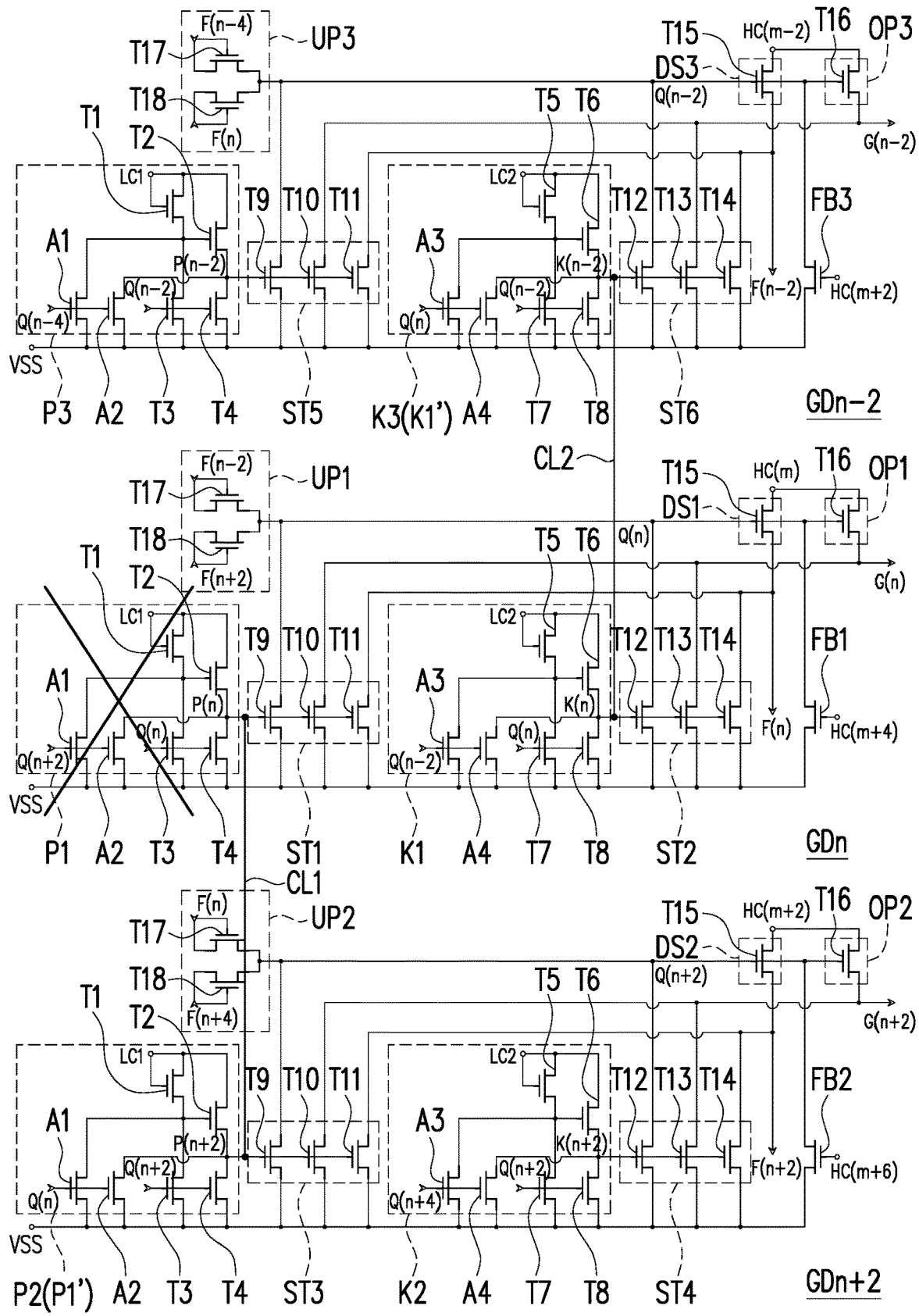
FIG. 7B is a schematic partial circuit of the device substrate of FIG. 7A.
Figure 8A:
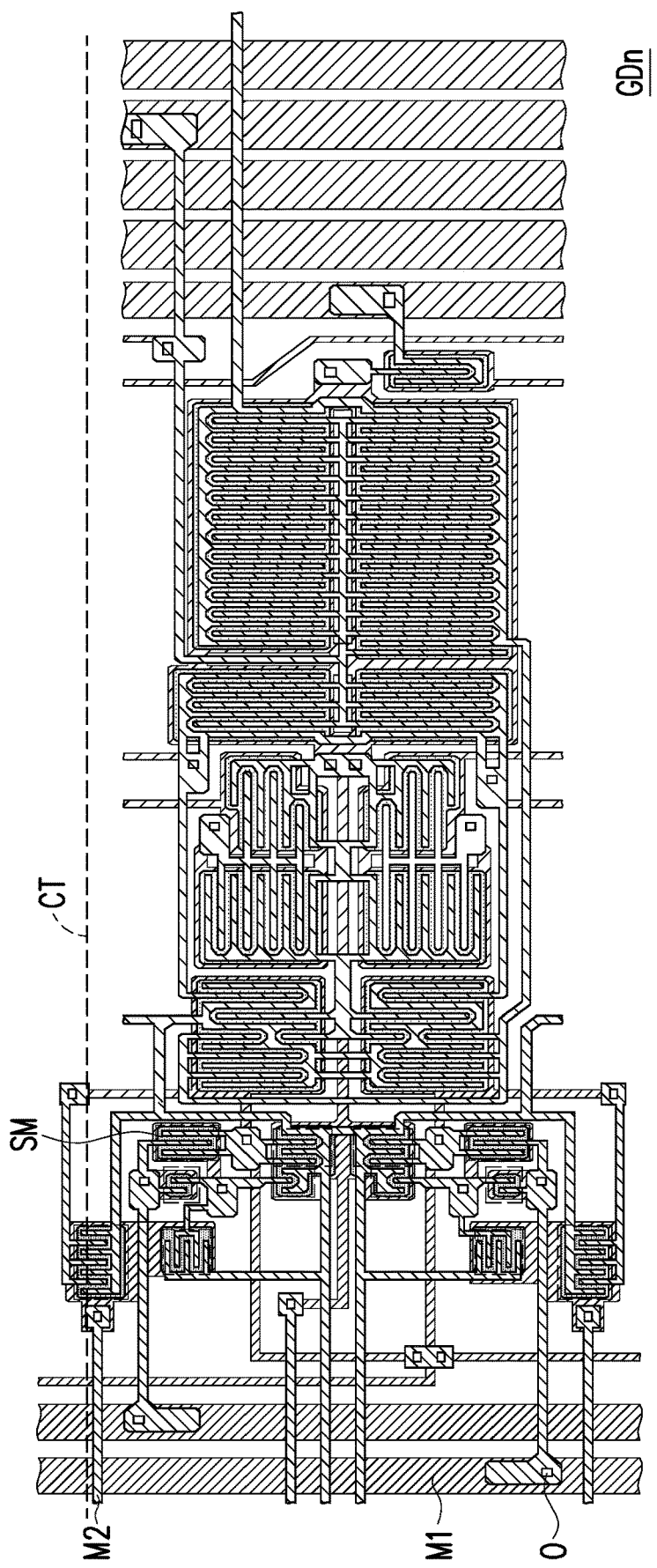
FIG. 8A is a schematic partial enlargement of FIG. 7A.
Figure 8B:
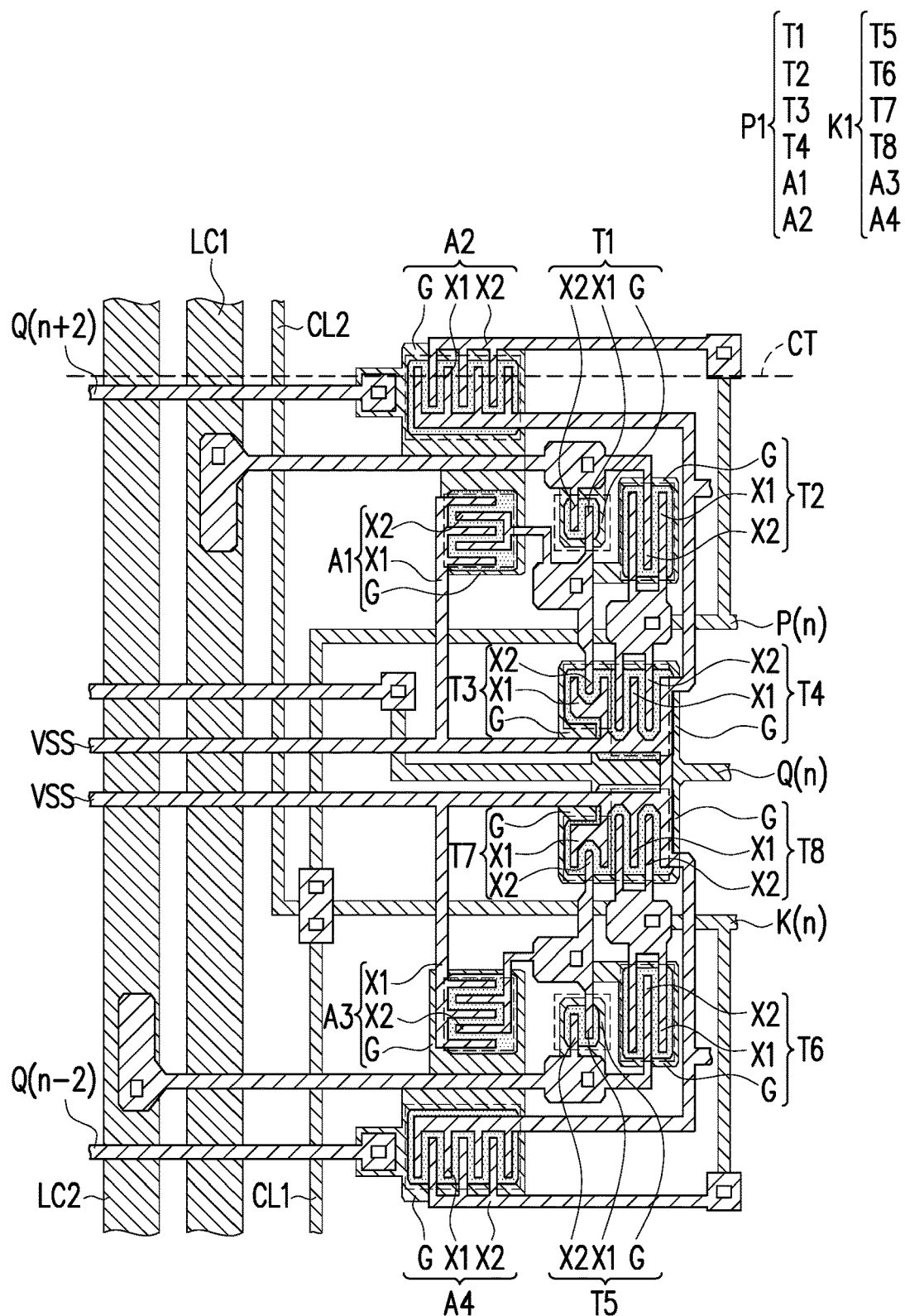
FIG. 8B is a schematic partial enlargement of FIG. 8A.

FIG. 7A is a schematic top view of a device substrate according to an embodiment of the present invention. FIG. 7B is a schematic partial circuit of the device substrate of FIG. 7A. FIG. 8A is a schematic partial enlargement of FIG. 7A. FIG. 8B is a schematic partial enlargement of FIG. 8A. It is to be noted that the embodiments of FIG. 7A, FIG. 7B, FIG. 8A, and FIG. 8B follow the device numbers and partial contents of the embodiments of FIG. 2A, FIG. 2B and FIG. 3A to FIG. 3C, where the same or similar reference numerals are used to represent the same or similar devices, and the description of the same technical content is omitted. For the description of the omitted portions, reference may be made to the foregoing embodiments, and the descriptions thereof are omitted herein.

Referring to FIG. 7A, FIG. 7B, FIG. 8A, and FIG. 8B simultaneously, the device substrate 10b is cut along a cutting path CT to form two new device substrates, one of which is a device substrate 10c. A lower side of the cutting path CT in FIG. 7A is the device substrate 10c. The cutting path CT overlaps the active area 110 and the peripheral area 120. Since the first auxiliary circuit P1 overlaps the cutting path CT, the first auxiliary circuit P1 is damaged after the cutting.

In the present embodiment, the first backup circuit P1' and the first auxiliary circuit P1 receive the same signal (the first low-frequency clock signal provided by the first low-frequency clock signal line LC1) and are electrically connected with each other via the first connection line CL1, such that the output terminal of the first backup circuit P1' and the output terminal of the first auxiliary circuit P1 are electrically connected with each other, that is, the P(n+2) point and the P(n) point are electrically connected with each other. Therefore, even if the first auxiliary circuit P1 is damaged, the first auxiliary circuit P1 may be replaced with the first backup circuit P1' of the (n+2)$^{th}$-stage driving unit GDn+2, so that the n$^{th}$-stage driving unit GDn may operate, thereby increasing the yield of a cutting process of the device substrate 10c. In addition, a device substrate 10c having high flexible dimension choices may be obtained under the design of shape cutting. A substrate of the device substrate 10c may be, for example, rectangular, or shaped to be non-rectangular.

Figure 9A:
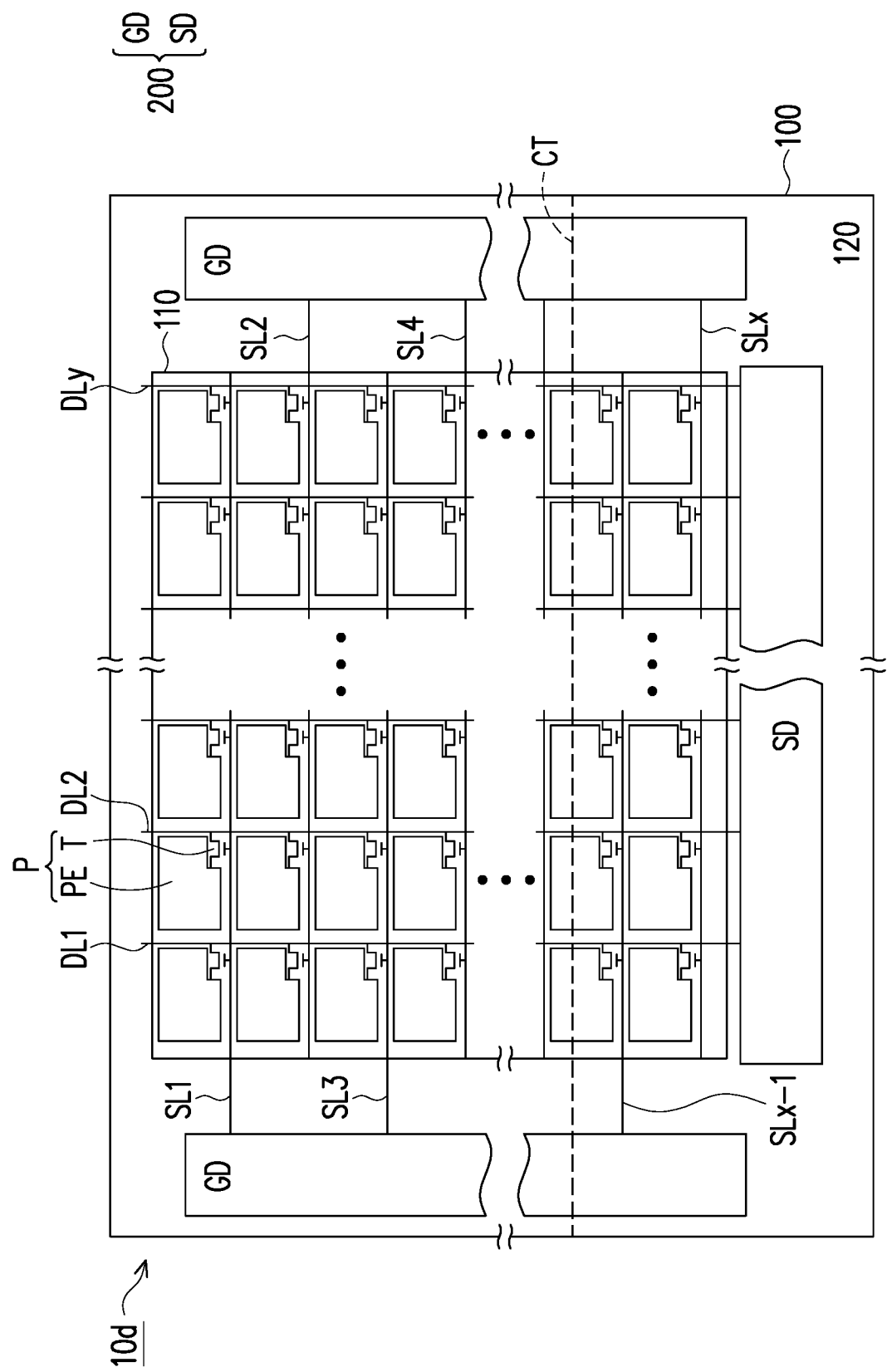
FIG. 9A is a schematic top view of a device substrate according to an embodiment of the present invention.
Figure 9B:
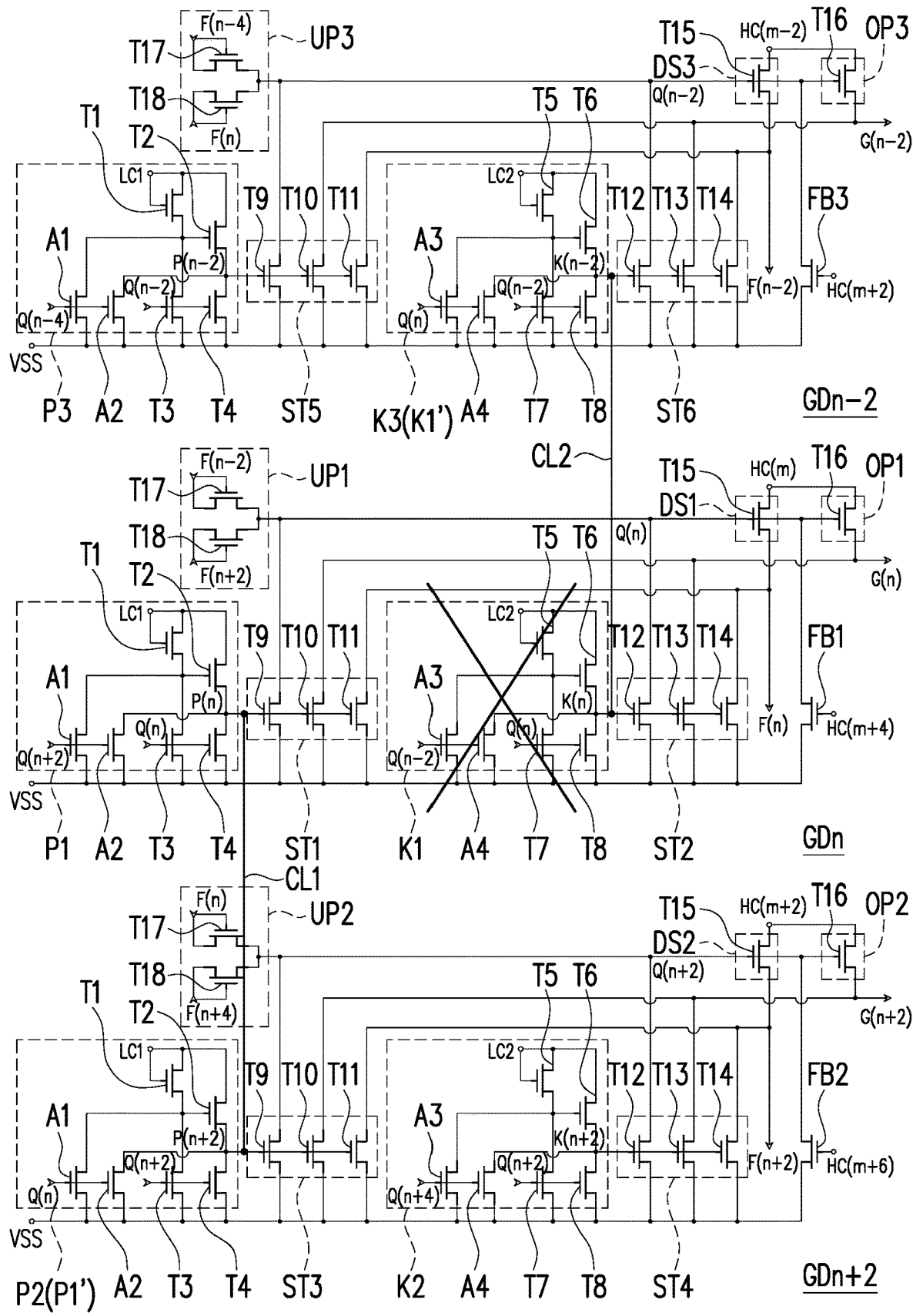
FIG. 9B is a schematic partial circuit of the device substrate of FIG. 9A.
Figure 10A:
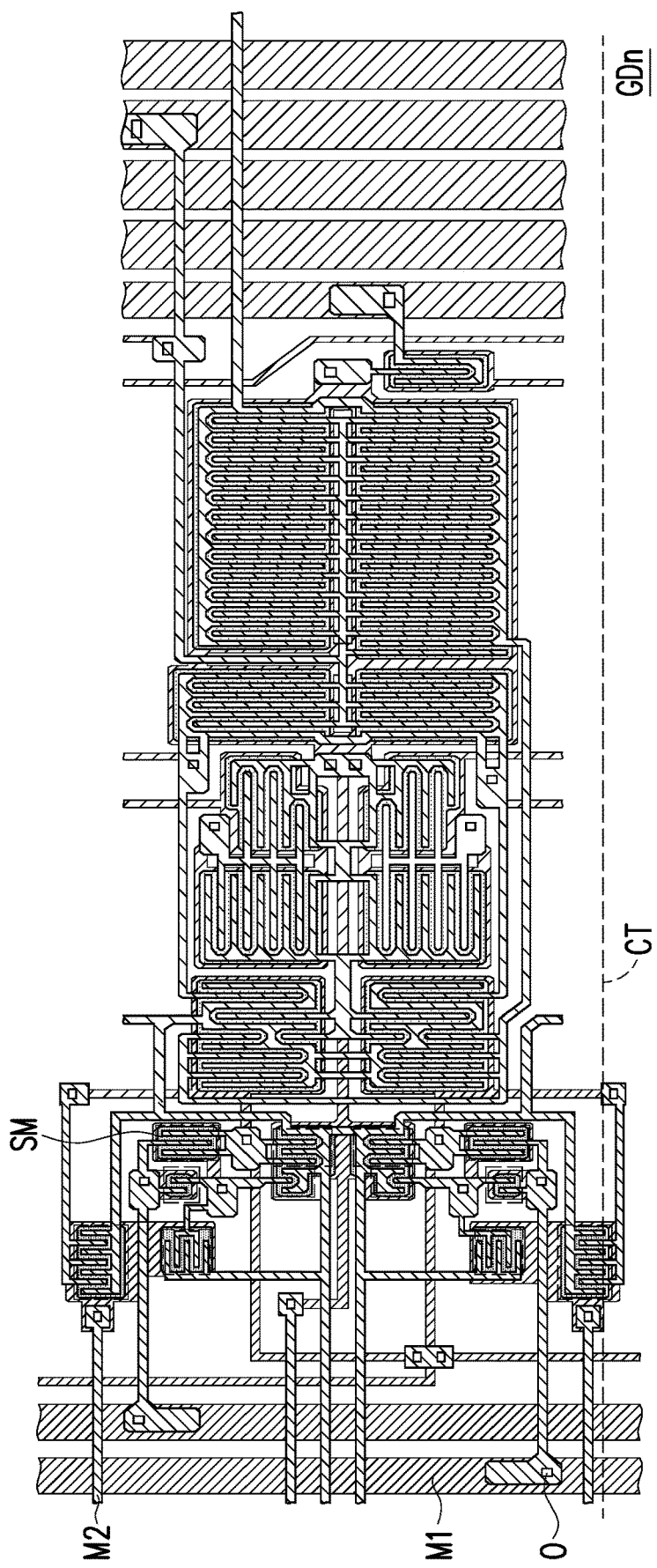
FIG. 10A is a schematic partial enlargement of FIG. 9A.
Figure 10B:
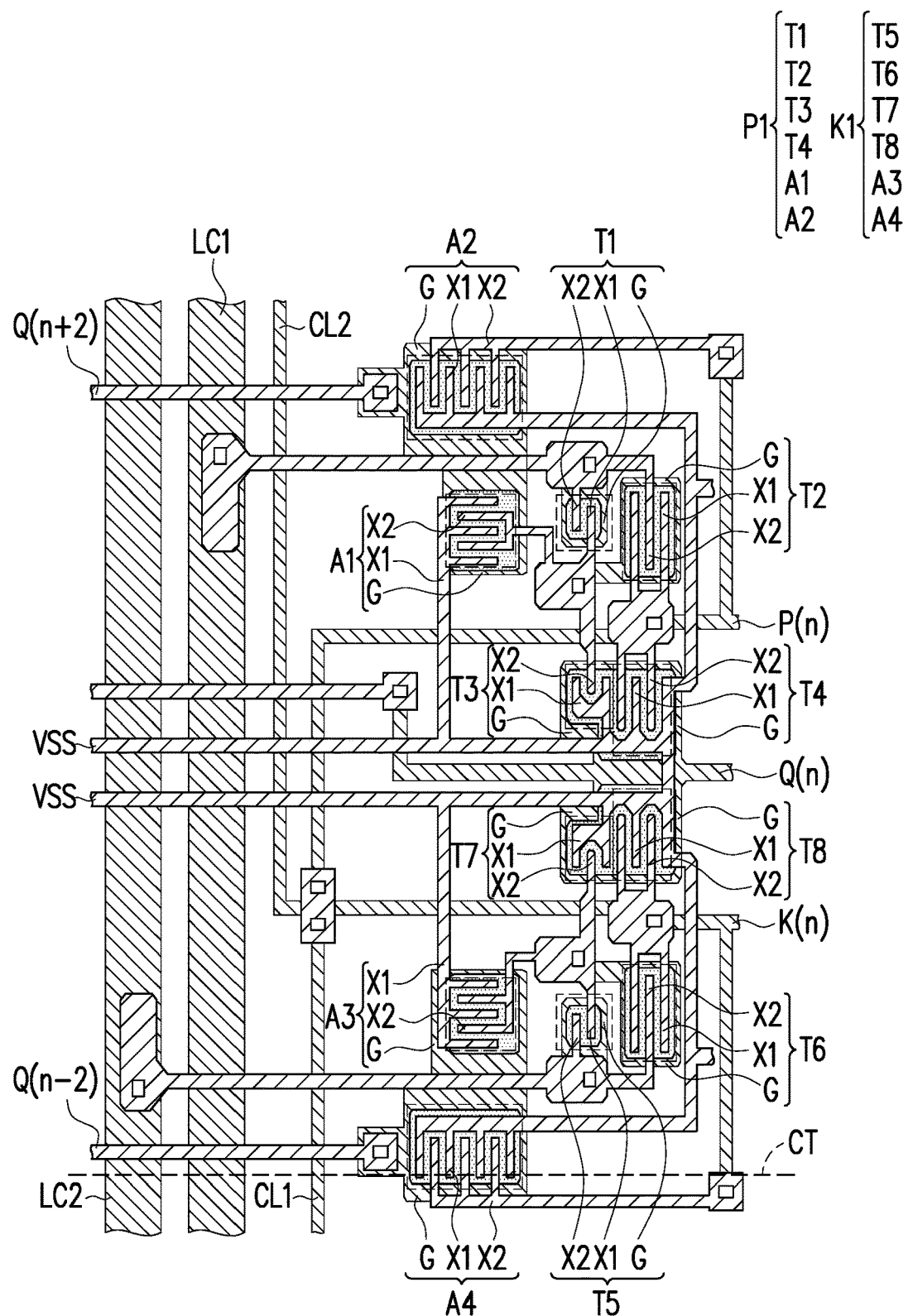
FIG. 10B is a schematic partial enlargement of FIG. 10A.

FIG. 9A is a schematic top view of a device substrate according to an embodiment of the present invention. FIG. 9B is a schematic partial circuit of the device substrate of FIG. 9A. FIG. 10A is a schematic partial enlargement of FIG. 9A. FIG. 10B is a schematic partial enlargement of FIG. 10A. It is to be noted that the embodiments of FIG. 9A, FIG. 9B, FIG. 9A, and FIG. 10B follow the device numbers and partial contents of the embodiments of FIG. 5A, FIG. 5B and FIG. 6A to FIG. 6C, where the same or similar reference numerals are used to represent the same or similar devices, and the description of the same technical content is omitted. For the description of the omitted portions, reference may be made to the foregoing embodiments, and the descriptions thereof are omitted herein.

Referring to FIG. 9A, FIG. 9B, FIG. 9A, and FIG. 10B, the device substrate 10b is cut along a cutting path CT to form two new device substrates, one of which is a device substrate 10d. An upper side of the cutting path CT in FIG. 9A is the device substrate 10d. The cutting path CT overlaps the active area 110 and the peripheral area 120. Since the second auxiliary circuit K1 of the n$^{th}$-stage driving unit GDn (first driving unit) overlaps the cutting path CT, the second auxiliary circuit K1 of the n$^{th}$-stage driving unit GDn (first driving unit) is damaged after the cutting in the location marked with a big X as shown in FIG. 9B.

In the present embodiment, the second backup circuit K1' (or referred to as the second auxiliary circuit K3 of the (n−2)$^{th}$-stage driving unit GDn−2) and the second auxiliary circuit K1 receive the same signal (the second low-frequency clock signal provided by the second low-frequency clock signal line LC2) and are electrically connected with each other via the second connection line CL2, such that the output terminal of the second backup circuit K1' (or referred to as the second auxiliary circuit K3 of the (n−2)$^{th}$-stage driving unit GDn−2) and the output terminal of the second auxiliary circuit K1 are electrically connected with each other, that is, the K(n+2) point and the K(n) point are electrically connected with each other. Therefore, even if the second auxiliary circuit K1 is damaged, the second auxiliary circuit K1 may be replaced with the second backup circuit K1' of the (n−2)$^{th}$-stage driving unit GDn−2, so that the n$^{th}$-stage driving unit GDn may operate, thereby increasing the yield of a cutting process of the device substrate 10d.

Figure 11:
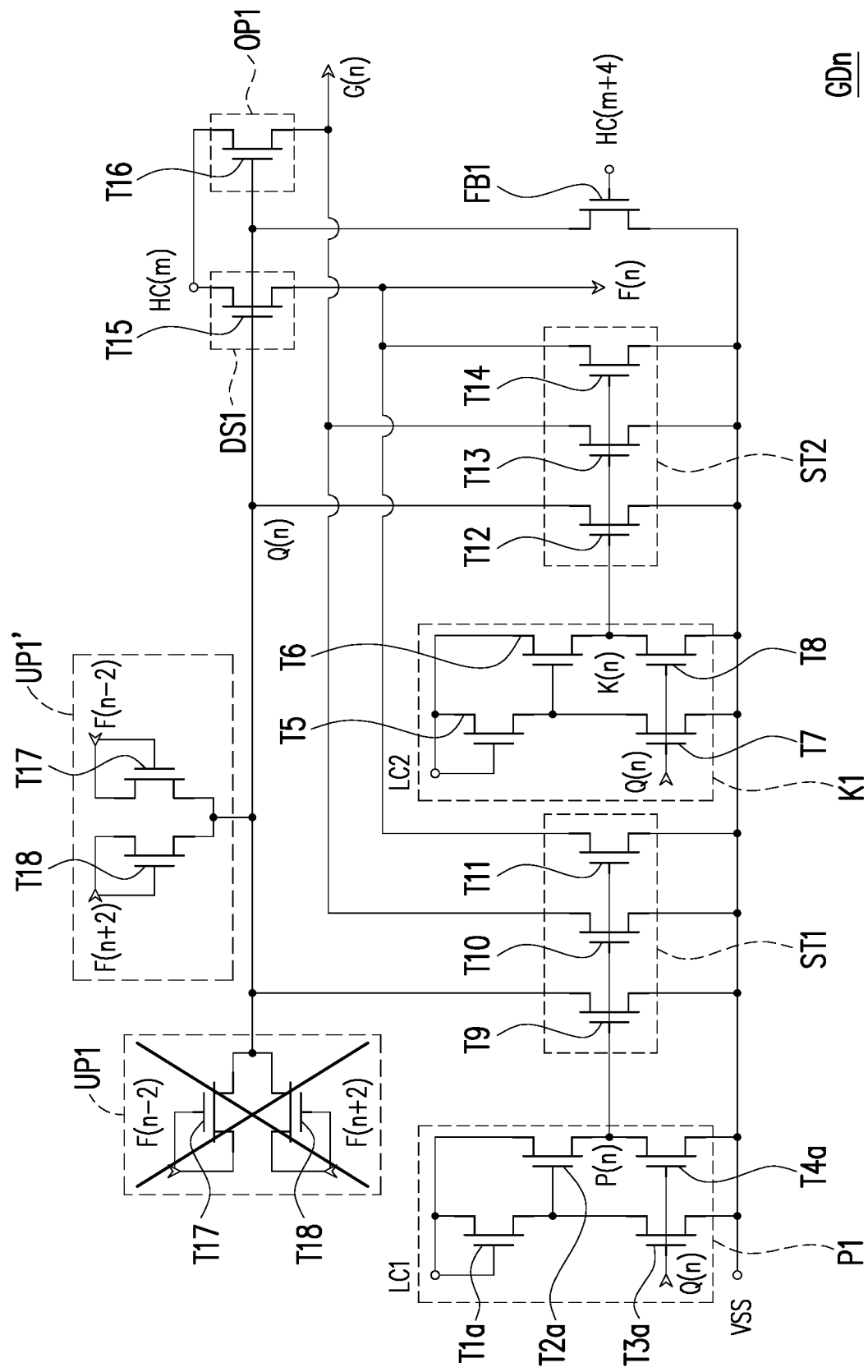
FIG. 11 is a schematic partial circuit of a device substrate according to an embodiment of the present invention.

FIG. 11 is a schematic partial circuit of a device substrate according to an embodiment of the present invention. It is to be noted that the embodiment of FIG. 11 follows the device numbers and partial contents of the embodiments of FIG. 2A, FIG. 2B and FIG. 3A to FIG. 3C, where the same or similar reference numerals are used to represent the same or similar devices, and the description of the same technical content is omitted. For the description of the omitted portions, reference may be made to the foregoing embodiments, and the descriptions thereof are omitted herein.

Referring to FIG. 11, in the present embodiment, the n$^{th}$-stage driving unit GDn (or referred to as the first driving unit) includes a first output circuit OP1, a first voltage control circuit UP1 and a first backup circuit UP1'. The first voltage control circuit UP1 and the first backup circuit UP1' are both pull-up circuits. In the present embodiment, the first voltage control circuit UP1 may also be referred to as a first auxiliary circuit.

The first voltage control circuit UP1 overlaps the cutting path, and therefore the first voltage control circuit UP1 is damaged after the cutting.

In the present embodiment, the first backup circuit UP1' does not overlap the cutting path and the first voltage control circuit UP1 and the first backup circuit UP1' receive the same signal (an (n−2)$^{th}$-stage downlink signal F(n−2) and an (n+2)$^{th}$-stage downlink signal F(n+2)) and transmit the same signal, and the output terminal of the first voltage control circuit UP1 and the output terminal of the first backup circuit UP1' are both electrically connected with the Q(n) point. Therefore, even if the first voltage control circuit UP1 is damaged, the first voltage control circuit UP1 may be replaced with the first backup circuit UP1', so that the n$^{th}$-stage driving unit GDn may operate, thereby increasing the yield of a cutting process of the device substrate.

Although the invention is described with reference to the above embodiments, the embodiments are not intended to limit the invention. A person of ordinary skill in the art may make variations and modifications without departing from the spirit and scope of the invention. Therefore, the protection scope of the invention should be subject to the appended claims.

What is claimed is:

1. A device substrate, comprising:
   a substrate, having an active area and a peripheral area adjacent to the active area, wherein a cutting path overlaps the active area and the peripheral area;
   a first output circuit, located on the peripheral area;
   a first auxiliary circuit, located on the peripheral area, the first auxiliary circuit overlapping the cutting path; and
   a first backup circuit, located on the peripheral area, wherein both of the first auxiliary circuit and the first backup circuit are pull-down circuits or are pull-up circuits, and wherein the shortest distance between the first backup circuit and the cutting path is from about 125 microns to about 300 microns.

2. The device substrate according to claim 1, further comprising:
   a second auxiliary circuit, located on the peripheral area;
   a first low-frequency clock signal line, adapted to provide a first low-frequency clock signal to at least one of the first auxiliary circuit and the first backup circuit;
   a second low-frequency clock signal line, adapted to provide a second low-frequency clock signal to the second auxiliary circuit, wherein the first low-frequency clock signal and the second low-frequency clock signal are reverse to each other; and
   a power line, electrically connected with the first auxiliary circuit, the first backup circuit, and the second auxiliary circuit.

3. The device substrate according to claim 2, wherein the first backup circuit, the first output circuit, the first auxiliary circuit, and the second auxiliary circuit are located in a first driving unit.

4. The device substrate according to claim 3, wherein the first backup circuit of the first driving unit comprises:
   a first active device;
   a second active device;
   a third active device, a first terminal of the first active device being electrically connected with a control terminal of the second active device and a second terminal of the third active device; and a fourth active device, a control terminal of the third
active device and a control terminal of the fourth active
device being electrically connected with a Q(n) point,
a first terminal of the third active device and a first
terminal of the fourth active device being electrically
connected with the power line, and a first terminal of
the second active device and a second terminal of the
fourth active device being electrically connected with a
P(n) point; and the second auxiliary circuit comprises:
a fifth active device, a control terminal of the fifth active
device and a second terminal of the fifth active device
being electrically connected with the second low-frequency clock signal line;
a sixth active device, a second terminal of the sixth active
device being electrically connected with the second
low-frequency clock signal line;
a seventh active device, a first terminal of the fifth active
device being electrically connected with a control terminal of the sixth active device and a second terminal
of the seventh active device; and
an eighth active device, a control terminal of the seventh
active device and a control terminal of the eighth active
device being electrically connected with the Q(n) point,
a first terminal of the seventh active device and a first
terminal of the eighth active device being electrically
connected with the power line, and a first terminal of
the sixth active device and a second terminal of the
eighth active device being electrically connected with a
K(n) point.

5. The device substrate according to claim 4, wherein a
control terminal of the first active device of the first backup
circuit and a second terminal of the first active device of the
first backup circuit are electrically connected with the first
low-frequency clock signal line, a second terminal of the
second active device of the first backup circuit is electrically
connected with the first low-frequency clock signal line, an
arrangement direction of a first active device of the first
auxiliary circuit and the first active device of the first backup
circuit is different from an extension direction of the cutting
path, a plurality of first openings are located at one side of
the cutting path, a plurality of second openings are located
at the other side of the cutting path, and the first auxiliary
circuit is electrically connected with the first low-frequency
clock signal line via an extension portion and the second
openings rather than via the first openings.

6. The device substrate according to claim 1, further
comprising:
a second auxiliary circuit, located on the peripheral area;
a second output circuit, located on the peripheral area;
a third auxiliary circuit, located on the peripheral area;
a first low-frequency clock signal line, electrically connected with the first backup circuit, and adapted to
provide a first low-frequency clock signal to the first
backup circuit;
a second low-frequency clock signal line, electrically
connected with the second auxiliary circuit and the
third auxiliary circuit, and adapted to provide a second
low-frequency clock signal to the second auxiliary
circuit and the third auxiliary circuit, wherein the first
low-frequency clock signal and the second low-frequency clock signal are reverse to each other; and
a power line, electrically connected with the first auxiliary
circuit, the second auxiliary circuit, the third auxiliary
circuit, and the first backup circuit.

7. The device substrate according to claim 6, wherein the
first output circuit, the first auxiliary circuit and the second
auxiliary circuit are located in a first driving unit, wherein
the second output circuit, the first backup circuit and the
third auxiliary circuit are located in a second driving unit,
and wherein the first driving unit is adjacent to the second
driving unit.

8. The device substrate according to claim 1, wherein the
first backup circuit does not overlap the cutting path.

9. A device substrate, comprising:
a substrate, having an active area and a peripheral area
adjacent to the active area;
a first driving unit, located on the substrate, and comprising:
a first output circuit, located on the peripheral area;
a first auxiliary circuit, located on the peripheral area;
a first backup circuit, located on the peripheral area,
wherein both of the first auxiliary circuit and the first
backup circuit are pull-up circuits or are pull-down
circuits, and wherein the first auxiliary circuit and
the first backup circuit receive a same signal; and
a second auxiliary circuit, located on the peripheral
area; and
a second driving unit, adjacent to the first driving unit,
located on the substrate, and comprising:
a second output circuit, located on the peripheral area;
a third auxiliary circuit, located on the peripheral area;
and
a second backup circuit, located on the peripheral area,
wherein both of the third auxiliary circuit and the
second backup circuit are both pull-up circuits or are
pull-down circuits, and wherein the third auxiliary
circuit and the second backup circuit receive a same
signal; and
a fourth auxiliary circuit, located on the peripheral area.

10. The device substrate according to claim 9, further
comprising:
a first low-frequency clock signal line, electrically connected with the first auxiliary circuit, the first backup
circuit and the fourth auxiliary circuit, and adapted to
provide a first low-frequency clock signal to the first
auxiliary circuit, the first backup circuit and the fourth
auxiliary circuit;
a second low-frequency clock signal line, electrically
connected with the third auxiliary circuit, the second
backup circuit and the second auxiliary circuit, and
adapted to provide a second low-frequency clock signal
to the third auxiliary circuit, the second backup circuit
and the second auxiliary circuit, wherein the first low-frequency clock signal and the second low-frequency
clock signal are reverse to each other; and
a power line, electrically connected with the first auxiliary
circuit, the second auxiliary circuit, the third auxiliary
circuit, the fourth auxiliary circuit, the first backup
circuit, and the second backup circuit.

11. The device substrate according to claim 10, wherein
each of the first auxiliary circuit of the first driving unit and
the first backup circuit of the first driving unit comprises:
a first active device, wherein a control terminal of the first
active device and a second terminal of the first active
device are electrically connected with the first low-frequency clock signal line;
a second active device, wherein a second terminal of the
second active device is electrically connected with the
first low-frequency clock signal line;
a third active device, wherein a first terminal of the first
active device is electrically connected with a control
terminal of the second active device and a second
terminal of the third active device; and a fourth active device, wherein a control terminal of the third active device and a control terminal of the fourth active device are electrically connected with a Q(n) point, a first terminal of the third active device and a first terminal of the fourth active device are electrically connected with the power line, and a first terminal of the second active device and a second terminal of the fourth active device are electrically connected with a P(n) point; and the second auxiliary circuit comprises:

a fifth active device, wherein a control terminal of the fifth active device and a second terminal of the fifth active device are electrically connected with the second low-frequency clock signal line;

a sixth active device, wherein a second terminal of the sixth active device is electrically connected with the second low-frequency clock signal line;

a seventh active device, wherein a first terminal of the fifth active device is electrically connected with a control terminal of the sixth active device and a second terminal of the seventh active device; and an eighth active device, wherein a control terminal of the seventh active device and a control terminal of the eighth active device are electrically connected with the Q(n) point, wherein a first terminal of the seventh active device and a first terminal of the eighth active device are electrically connected with the power line, and wherein a first terminal of the sixth active device and a second terminal of the eighth active device are electrically connected with a K(n) point.

12. The device substrate according to claim 11, wherein the first driving unit further comprises:

a first voltage stabilizing circuit, electrically connected with the first auxiliary circuit of the first driving unit and the first backup circuit of the first driving unit, wherein the first voltage stabilizing circuit comprises:

a ninth active device, wherein a second terminal of the ninth active device is electrically connected with the Q(n) point;

a tenth active device, wherein a second terminal of the tenth active device is electrically connected with an output terminal of the first output circuit; and an eleventh active device, wherein a control terminal of the ninth active device, a control terminal of the tenth active device and a control terminal of the eleventh active device are electrically connected with the P(n) point, and wherein a first terminal of the ninth active device, a first terminal of the tenth active device and a first terminal of the eleventh active device are electrically connected with the power line;

a second voltage stabilizing circuit, comprising:

a twelfth active device, wherein a second terminal of the twelfth active device is electrically connected with the Q(n) point;

a thirteenth active device, wherein a second terminal of the thirteenth active device is electrically connected with the output terminal of the first output circuit; and a fourteenth active device, wherein a control terminal of the twelfth active device, a control terminal of the thirteenth active device and a control terminal of the fourteenth active device are electrically connected with the K(n) point, and wherein a first terminal of the twelfth active device, a first terminal of the thirteenth active device and a first terminal of the fourteenth active device are electrically connected with the power line;

a first downlink circuit, comprising a fifteenth active device, wherein a control terminal of the fifteenth active device is electrically connected with the Q(n) point, a first terminal of the fifteenth active device is adapted to output an $n^{th}$-stage downlink signal F(n), a second terminal of the fifteenth active device is electrically connected with a first high-frequency clock signal line, and a second terminal of the eleventh active device and a second terminal of the fourteenth active device are electrically connected with the first downlink circuit, wherein the first output circuit comprises a sixteenth active device, wherein a control terminal of the sixteenth active device is electrically connected with the Q(n) point, a first terminal of the sixteenth active device serves as the output terminal of the first output circuit to output an $n^{th}$-stage gate signal G(n), and a second terminal of the sixteenth active device is electrically connected with the first high-frequency clock signal line;

a first voltage control circuit, comprising:

a seventeenth active device, wherein a control terminal of the seventeenth active device and a second terminal of the seventeenth active device are adapted to receive an $(n-2)^{th}$-stage downlink signal F(n−2); and an eighteenth active device, wherein a control terminal of the eighteenth active device and a second terminal of the eighteenth active device are adapted to receive an $(n+2)^{th}$-stage downlink signal F(n+2), and a first terminal of the seventeenth active device and a first terminal of the eighteenth active device are electrically connected with the Q(n) point; and a first feedback device, wherein a control terminal of the first feedback device is electrically connected with a second high-frequency clock signal line, a first terminal of the first feedback device is electrically connected with the power line, and a second terminal of the first feedback device is electrically connected with the Q(n) point.

13. A device substrate, comprising:

a substrate, having an active area and a peripheral area adjacent to the active area;

a first driving unit, located on the substrate, and comprising:

a first output circuit, located on the peripheral area;

a first auxiliary circuit, located on the peripheral area; and a second auxiliary circuit, located on the peripheral area;

a second driving unit, adjacent to the first driving unit, and comprising:

a second output circuit, located on the peripheral area;

a first backup circuit, located on the peripheral area; and a third auxiliary circuit, located on the peripheral area; and a first connection line, electrically connecting the first backup circuit to the first auxiliary circuit, wherein both of the first backup circuit and the first auxiliary circuit are pull-up circuits or are pull-down circuits, and the first backup circuit and the first auxiliary circuit receive a same signal.

14. The device substrate according to claim 13, further comprising:

a first low-frequency clock signal line, electrically connected with the first auxiliary circuit and the first backup circuit to provide a first low-frequency clock signal to the first auxiliary circuit and the first backup circuit;

a second low-frequency clock signal line, electrically connected with the second auxiliary circuit and the third auxiliary circuit to provide a second low-frequency clock signal to the second auxiliary circuit and the third auxiliary circuit, wherein the first low-frequency clock signal and the second low-frequency clock signal are reverse to each other; and a power line, electrically connected with the first auxiliary circuit, the second auxiliary circuit, the third auxiliary circuit, and the first backup circuit.

15. The device substrate according to claim 14, wherein each of the first auxiliary circuit of the first driving unit and the first backup circuit of the second driving unit comprises:

a first active device, wherein a control terminal of the first active device and a second terminal of the first active device are electrically connected with the first low-frequency clock signal line;

a second active device, wherein a second terminal of the second active device is electrically connected with the first low-frequency clock signal line;

a third active device;

a fourth active device, wherein a control terminal of the third active device is electrically connected with a control terminal of the fourth active device;

a first switching device, wherein a first terminal of the first active device is electrically connected with a control terminal of the second active device, a second terminal of the first switching device and a second terminal of the third active device; and a second switching device, wherein a control terminal of the first switching device is electrically connected with a control terminal of the second switching device, wherein a first terminal of the first switching device, a first terminal of the second switching device, a first terminal of the third active device, and a first terminal of the fourth active device are electrically connected with the power line, and wherein a first terminal of the second active device, a second terminal of the second switching device and a second terminal of the fourth active device are electrically connected with each other.

16. The device substrate according to claim 15, wherein the first backup circuit and the first auxiliary circuit are both pull-up circuits, and wherein a first terminal of the second active device, a second terminal of the second switching device and a second terminal of the fourth active device of the first auxiliary circuit of the first driving unit are electrically connected with a first terminal of the second active device, a second terminal of the second switching device and a second terminal of the fourth active device of the first backup circuit of the second driving unit via the first connection line.

17. The device substrate according to claim 14, further comprising:

a third driving unit located on the substrate, wherein the first driving unit is located between the third driving unit and the second driving unit, and the third driving unit comprises:
a third output circuit;
a second backup circuit; and
a fourth auxiliary circuit; and a second connection line, electrically connecting the second backup circuit to the second auxiliary circuit, wherein both of the second backup circuit and the second auxiliary circuit are pull-up circuits or are pull-down circuits, and wherein the second backup circuit and the second auxiliary circuit receive a same signal.

18. The device substrate according to claim 17, wherein each of the second auxiliary circuit of the first driving unit and the second backup circuit of the third driving unit comprises:

a fifth active device, wherein a control terminal of the fifth active device and a second terminal of the fifth active device are electrically connected with the second low-frequency clock signal line;

a sixth active device, wherein a second terminal of the sixth active device is electrically connected with the second low-frequency clock signal line;

a seventh active device;

an eighth active device, wherein a control terminal of the seventh active device is electrically connected with a control terminal of the eighth active device;

a third switching device, wherein a first terminal of the fifth active device is electrically connected with a control terminal of the sixth active device, a second terminal of the third switching device and a second terminal of the seventh active device; and a fourth switching device, wherein a control terminal of the third switching device is electrically connected with a control terminal of the fourth switching device, wherein a first terminal of the third switching device, a first terminal of the fourth switching device, a first terminal of the seventh active device, and a first terminal of the eighth active device are electrically connected with the power line, and wherein a first terminal of the sixth active device, a second terminal of the fourth switching device and a second terminal of the eighth active device are electrically connected with each other.

19. The device substrate according to claim 18, wherein the second auxiliary circuit of the first driving unit and the second backup circuit of the third driving unit are both pull-down circuits, and wherein a first terminal of the sixth active device, a second terminal of the fourth switching device and a second terminal of the eighth active device of the second auxiliary circuit of the first driving unit are electrically connected with a first terminal of the sixth active device, a second terminal of the fourth switching device and a second terminal of the eighth active device of the second backup circuit of the third driving unit via the second connection line.

* * * * *